United States Patent
Meinhart

(10) Patent No.: US 12,321,209 B1
(45) Date of Patent: *Jun. 3, 2025

(54) METHOD OF SUBSIDIZING COST OF PROVIDING INFORMATION

(71) Applicant: MARA Holdings, Inc., Las Vegas, NV (US)

(72) Inventor: Carl Meinhart, Santa Barbara, CA (US)

(73) Assignee: MARA Holdings, Inc., Las Vegas, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/983,028

(22) Filed: Dec. 16, 2024

Related U.S. Application Data

(63) Continuation-in-part of application No. 18/780,850, filed on Jul. 23, 2024, which is a continuation-in-part of application No. 18/628,636, filed on Apr. 5, 2024, now Pat. No. 12,171,084.

(51) Int. Cl.
*G06F 1/20* (2006.01)
*H05K 7/20* (2006.01)

(52) U.S. Cl.
CPC ............... *G06F 1/20* (2013.01); *H05K 7/203* (2013.01)

(58) Field of Classification Search
CPC ............ G06F 1/20; G06F 1/206; F28D 15/02; H05K 7/203
See application file for complete search history.

(56) References Cited

U.S. PATENT DOCUMENTS

| 4,211,207 A | 7/1980 | Molivadas |
| 7,342,787 B1 * | 3/2008 | Bhatia ................... H01L 23/427 165/185 |
| 11,761,689 B1 | 9/2023 | Stolyarov et al. |
| 12,171,084 B1 * | 12/2024 | Meinhart ............... H05K 7/203 |
| 2012/0048716 A1 | 3/2012 | Sonnek et al. |
| 2014/0218858 A1 * | 8/2014 | Shelnutt ................. H05K 7/203 361/679.31 |

(Continued)

FOREIGN PATENT DOCUMENTS

CN 113242679 A1 8/2021

OTHER PUBLICATIONS

Bederna Gregor et al., "Devices and methods for carrying out cyclic processes", dated Jun. 2, 2021, 70 pages.

*Primary Examiner* — Mark A Connolly
(74) *Attorney, Agent, or Firm* — Fish IP Law, LLP

(57) ABSTRACT

The inventive subject matter provides for repurposing otherwise wasted thermal energy to drive a commercial process. Thermal energy from a cooling system containing a computer system and at least one manifold that is operably coupled with a compressor, heat exchanger, pressure regulator, and controller, to provide thermal energy at an elevated temperature to drive the commercial process. The cooling system can advantageously be used to cool computer systems, including Bitcoin miners, crypto miners, high-performance computers, AI computers, or other thermal energy producing devices. The system operates by extracting vapor of the working fluid from the manifold, increasing the pressure and temperature of the extracted vapor by compression, and then passing this vapor to a heat exchanger, thereby providing thermal energy to drive the commercial process.

20 Claims, 14 Drawing Sheets

(56) References Cited

U.S. PATENT DOCUMENTS

| | | |
|---|---|---|
| 2014/0218859 A1 | 8/2014 | Shelnutt et al. |
| 2015/0060009 A1 | 3/2015 | Shelnutt et al. |
| 2015/0233619 A1 | 8/2015 | Shedd |
| 2019/0357379 A1* | 11/2019 | Kolar ................. H05K 7/20827 |
| 2020/0089293 A1* | 3/2020 | Enright ............. H05K 7/20818 |
| 2020/0205318 A1* | 6/2020 | Hulse ................. H05K 7/20809 |
| 2022/0087049 A1 | 3/2022 | Smith |
| 2022/0369493 A1 | 11/2022 | Alissa et al. |
| 2022/0394880 A1 | 12/2022 | van Wijk et al. |
| 2022/0408602 A1* | 12/2022 | Gao ........................ G06F 1/206 |
| 2023/0403821 A1* | 12/2023 | Oruganti ................ H05K 7/203 |

\* cited by examiner

METHOD OF SUBSIDIZING COST OF PROVIDING INFORMATION

PRIORITY CLAIM

This application is a Continuation-In-Part (CIP) of U.S. non-provisional application Ser. No. 18/780,850 filed Jul. 23, 2024, which is a Continuation-In-Part (CIP) of U.S. non-provisional application Ser. No. 18/628,636 filed Apr. 5, 2024, both of which of are incorporated herein by reference. Where a definition or use of a term in a reference that is incorporated by reference is inconsistent or contrary to the definition of that term provided herein, the definition or use of that term provided herein is deemed to be controlling.

FIELD OF THE INVENTION

The field of invention is high-performance computer systems, including for example Bitcoin mining and artificial intelligence computing.

BACKGROUND

The following description includes information that can be useful in understanding the present invention. It is not an admission that any of the information provided herein is prior art or relevant to the presently claimed invention, or that any publication specifically or implicitly referenced is prior art.

Prior art two-phase immersion-cooling computer systems require CPUs/Miners to be immersed in a dielectric working fluid. The dielectric fluid undergoes a phase change from a saturated liquid to a saturated vapor. The saturated vapor is condensed back into the liquid by removing thermal energy, such that the liquid can be reused in the cooling process. However, this process of removing thermal energy requires additional energy to drive pumps and/or cooling fans. In addition, rejecting this thermal energy to the surrounding environment can require that the surrounding environment be at a lower temperature than the dielectric working fluid.

The standard practice in the high-performance computing industry is to reject the thermal energy from the working fluid by extracting thermal energy (i.e. internal energy or enthalpy). In contrast to standard practice in the high-performance computing industry, in the inventive subject matter, energy is added to the working fluid vapor by compressing the vapor, before the thermal energy is extracted.

Thermal energy generated from computer systems can be at a relatively low temperature of 40° C. to 80° C., or even 40° C. to 50° C. which means that according to the second law of thermodynamics, removing the generated thermal energy is not very efficient for producing useful mechanical work. For example, assuming a waste thermal energy temperature of $T_h$=60° C. (333K), and a heat sink ambient temperature of $T_c$=20° C. (293K), a Carnot heat engine (ideal heat engine) has a maximum theoretical efficiency of $\eta_{HE}$=1−$T_c$/$T_h$=1−293/333=0.12 (as discussed by Cengel, Y. A., Boles, M. A. Thermodynamics: An Engineering Approach, 8$^{th}$ Ed. McGraw Hill, incorporated herein by reference). This means that a heat engine could at best convert 12% of the waste thermal energy into mechanical work and the remaining 88% would need to be rejected by a different mechanism such as heat transfer. This low efficiency renders impractical the use of a heat engine to extract enthalpy from the resulting thermal energy for mechanical work.

In the of field high-performance computing, such as Artificial Intelligence computing, crypto mining, Bitcoin mining, or other computing environments, computer systems take in electrical energy and information, perform computations using that information, and then output information relating to those computations. This process converts the electrical energy into thermal energy. This thermal energy must then be rejected to the surrounding environment.

High-performance computing (including Artificial Intelligence computing) can utilize large immersion-cooling systems to remove the resulting thermal energy from the CPUs. The resulting thermal energy may be at too low of a temperature to be efficiently used for other purposes. In some cases, the application or transfer of thermal energy is used in the production of a product or service.

The inability to repurpose the resulting thermal energy in an efficient manner to drive additional commercial processes is a longstanding problem in the high-performance computing industry. This problem is particularly important for Bitcoin mining, which utilizes very significant amounts of electrical energy. Most of the resulting thermal energy is rejected to the surrounding environment, and currently there are few practical ways to utilize the rejected thermal energy to offset the energy cost.

SUMMARY OF THE INVENTION

The inventive subject matter provides apparatus, systems, and methods in which costs of using computer systems to provide information can be subsidized by repurposing otherwise wasted thermal energy to drive at least one commercial process.

By using the otherwise wasted thermal energy for additional commercial processes, the commercial process can provide revenue to help offset the total energy cost of the information process. This is particularly important in the Bitcoin mining industry where profit margins are being reduced because the profit incentives of Bitcoin mining are being reduced, and global competition is increasing. Accordingly, the information provided by systems and methods contemplated herein can include Bitcoin hashes and artificial intelligence (AI) computations.

In some cases, the thermodynamic system can operate by extracting vapor from the headspace of an immersion-cooling tank. In some cases, the thermal energy from this vapor can be more efficiently utilized by first increasing the temperature and pressure by vapor-phase compression of the working fluid to a higher temperature and pressure. In some cases, the higher temperature of the working fluid can then be used to transfer thermal energy using heat transfer through a heat exchanger, to drive a commercial process.

As used herein, the term "commercial process" means the application or transfer of thermal energy that is used in the production of a product or service. In some cases, the transfer of thermal energy is to a solid or fluid. In some cases, the transfer of thermal energy is to a gas. Exemplary commercial processes include generating mechanical work through a turbine, distilling industrial chemicals, distilling petroleum chemicals, heating or boiling water, distilling water, distilling alcohol, desalination of water, sensible heating of water, sensible heating of aqueous or non-aqueous mixtures, sensible heating of petroleum fluids, sensible heating of solids, heating of phase-change materials. As used herein, "sensible heating" means heating that increases the temperature of an object with little or no phase change.

The systems and methods contemplated herein can use any suitable working fluid in the immersion-cooling process, including commercially-available fluids having a boiling temperature of 40° C. to 80° C., inclusive. Exemplary working fluids include 3M FC 72 (B.P. 56° C.), 3M FC 3284 (B.P. 49° C.), Solvay Galden HT™ 55 (B.P. 55° C.), 3M Novec 7000™ (B.P. 34° C.), 3M Novec 7100™ (B.P. 61° C.), 3M Novec 7200™ (B.P. 76° C.), Novec 649™ (B.P. 49° C.), R32, R125, R134a, R227, R-1234yf, R-1234ze, R-1234zd, chemistries such as PFCs, HFEs, FKs, HFOs, and mixtures thereof.

In some cases, the compression step of the thermodynamic system can advantageously raise the temperature of the working fluid by an amount that is appropriate for a co-located commercial process. In some embodiments, for example, this can be an increase of 75-100° C., 25-75° C., 35-55° C., or even 1-25° C. From another perspective the compression step of the thermodynamic system can advantageously raise the temperature of the working fluid to 60-80° C., 80-110° C., 110° C.-125° C., or even 125° C.-160° C. If the co-located commercial process comprises boiling water, for example, the thermal energy input could have a temperature of approximately 112° C., and if the working fluid in the immersion-cooling process has a boiling point of 76° C., the compression step could be configured to raise the temperature of the working fluid by approximately 36° C. If the co-located commercial process comprises sensibly heating water, for example, the thermal energy input could have a temperature of approximately 90° C., and if the working fluid in the immersion-cooling process has a boiling point of 61° C., the compression step could be configured to raise the temperature of the working fluid by approximately 29° C.

Removing thermal energy from the thermodynamic system can be accomplished in any suitable manner, including, for example, using a heat exchanger, a condenser, or the like.

In order to more easily describe the relevant thermodynamic processes mathematically, thermodynamic processes are often idealized as being quasi-steady and in quasi-equilibrium. In addition, processes can be idealized as occurring with some constant property, such as constant temperature (isothermal), constant pressure (isobaric), constant volume (isochoric), constant enthalpy (isenthalpic), constant entropy (isentropic), or has no heat transfer (adiabatic). These idealizations provide a convenient framework for describing and analyzing these processes. It is contemplated that in practice these idealized thermodynamic processes can be used to approximate actual thermodynamic processes, but that they are only an approximation, and the actual thermodynamic processes will deviate from the idealization.

One example is fluid flowing through a pipe, tube, or heat exchanger can have a pressure drop resulting from viscous losses of the fluid. This pressure drop can be finite, but relatively small compared to relevant thermodynamic pressure scale. Therefore, this pressure drop can be important from a fluid mechanics viewpoint to drive the flow, but might not be important from a thermodynamic viewpoint, because a small but finite pressure drop (substantially isobaric) doesn't significantly affect the thermodynamic process or resulting thermodynamic state.

In another example of nucleic boiling, the bubbles create fluctuations in the local pressure field. However, from a thermodynamic viewpoint, the process is again substantially isobaric.

As used herein, the term "substantially" with respect to isobaric, isenthalpic, and isentropic processes means the actual process used results in a thermodynamic state with property values that are within 25% of the property values what would result from the associated ideal process. For example, if the process is substantially isobaric, then the absolute pressure resulting from the process is within 25% of the absolute pressure before the process occurs. Similarly, if the process is substantially isenthalpic, then the enthalpy resulting from the process is within 25% of the enthalpy before the process occurs. Similarly, if the process is substantially isentropic, then the entropy resulting from the process is within 25% of the entropy before the process occurs.

As used herein, the term "nearly" with respect to isobaric, isenthalpic, and isentropic processes means the actual process used results in a thermodynamic state with property values that are within 10% of the property values what would result from the associated ideal process. For example, if the process is nearly isobaric, then the absolute pressure resulting from the process is within 10% of the absolute pressure before the process occurs. Similarly, if the process is nearly isenthalpic, then the enthalpy resulting from the process is within 10% of the enthalpy before the process occurs. Similarly, if the process is nearly isentropic, then the entropy resulting from the process is within 10% of the entropy before the process occurs.

For the purposes of determining the scope of "substantially" and "nearly" when describing isenthalpic or isentropic processes, enthalpy and entropy values can be relative to a reference state defined as a saturated liquid at a temperature of 250 K. If the thermodynamic properties relative to this reference state are not supplied by the manufacturer, an external laboratory, such as a NIST-certified laboratory, can be used to measure these properties. Alternatively, for low temperatures and pressures, the Clausius-Clapeyron relation can be used, and constant values of specific heat and latent heat can be assumed to estimate thermodynamic properties relative to the reference state.

In another example, the thermodynamic process of compressing a vapor can be idealized as an isentropic process, which can occur if the process is adiabatic and internally reversible. However, in practice there can be some type of irreversibility that generates entropy. Furthermore, there can be heat transfer to or from surroundings that can also transfer entropy to or from the working fluid.

In another example, an isenthalpic thermodynamic process can be an idealization of flow through a device that is well insulated, does not significantly exchange heat with the surrounding environment (adiabatic), and where the main form of exchanging energy can be limited to flow in and/or out of the device. Examples of idealized isenthalpic flow can include flow through well-insulated pipes, tubes, valves, pressure regulators, expansion valves, diffusers, and nozzles.

The recitation of ranges of values herein is merely intended to serve as a shorthand method of referring individually to each separate value falling within the range. Unless otherwise indicated herein, each individual value is incorporated into the specification as if it were individually recited herein, and ranges include their endpoints.

Some aspects of the current disclosure provide a method of subsidizing a cost of providing information. In some cases, the disclosed method comprises providing a cooling system comprising at least one manifold in thermal communication with a computer system, wherein an elevated-low-pressure liquid-phase of a working fluid flows through the manifold, and the computer system providing the information; directing the elevated-low-pressure vapor-phase of the working fluid from the at least one manifold to a compressor; compressing the elevated-low-pressure vapor-phase of the working fluid to produce an elevated-high-pressure vapor-phase of the working fluid, wherein the elevated-high-pressure vapor-phase of the working fluid has a higher temperature than the working fluid in the manifold because the compressing process can increase the temperature of the working fluid; utilizing the elevated-high-pressure vapor-phase of the working fluid in a heat exchanger to drive a commercial process, during which the elevated-high-pressure vapor-phase of the working fluid is condensed to an elevated-high-pressure liquid-phase of the working fluid; reducing a pressure of the elevated-high-pressure liquid-phase of the working fluid to produce an elevated-low-pressure liquid-phase of the working fluid; returning the elevated-low-pressure liquid-phase of the working fluid to the at least one manifold; and monitoring and controlling among at least one or at least two of the computer system, the compressor, the pressure regulator, an optional phase separator, optional pumps, and the commercial process. In some cases, the commercial process can comprise heating of water. In some cases, the commercial process can comprise sensible heating of water. In some cases, the information comprises a Bitcoin hash. In some cases, the information comprises an artificial intelligence (AI) computation. In some cases, the working fluid comprises a mixture of at least two different working fluids, wherein each component of the mixture has at least two different saturation temperatures within the manifold. In some cases, the working fluid has a saturation temperature in the manifold of 50° C. to 80° C., inclusive. In some cases, the commercial process comprises district heating.

As used herein, the term "manifold" refers to a container that comprises a partially-enclosed space, wherein the partially-enclosed space is in fluid communication with at least one inlet and at least one outlet. The at least one inlet and at least one outlet allow for fluid to move into and out of the partially-enclosed space. In some cases, an at least one manifold can be configured to support pressures that are lower or higher than the standard atmosphere ("atm") which is defined as 101,325 Pa. In some cases, the pressure inside the at least one manifold is higher than atmospheric pressure, for example, at 1.1 atm, 1.5 atm, 2 atm, 3 atm, 4 atm, 5 atm, 6 atm, 7 atm, 8 atm, 9 atm, 10 atm, 15 atm, 20 atm, 30 atm, 40 atm, 50 atm, 100 atm, or between any of the above values, for example between 2 and 10 atm, between 5 and 10 atm, between 6 and 8 atm, etc. In some cases, the pressure inside the at least one manifold is lower than atmospheric pressure, for example, at 0.01 atm, at 0.05 atm, at 0.1 atm, 0.2 atm, 0.3 atm, 0.4 atm, 0.5 atm, 0.6 atm, 0.7 atm, 0.8 atm, 0.9 atm, or between any of the above values, for example between 0.1 and 0.9 atm, between 0.01 and 0.1 atm, between 0.5 and 0.9 atm, etc. In some cases, the cooling system further comprises at least two manifolds that are in thermal communication with the computer system. In some cases, the cooling system further comprises at least three manifolds that are in thermal communication with the computer system. In some cases, the cooling system further comprises at least four manifolds that are in thermal communication with the computer system.

For the avoidance of doubt, the term "thermal communication" refers to the ability to transfer thermal energy between one or more entities. The transfer of thermal energy can be in the form of conduction, convection or radiation.

In some cases, the disclosed method further comprises monitoring and controlling at least three of the computer system, the at least one manifold, the compressor, the pressure regulator, an optional phase separator, optional pumps and the commercial process. In some cases, the disclosed method further comprises using feedback to control a rate of electrical energy usage by the computer system as a function of electrical energy cost and/or computational incentives.

Some aspects of the current disclosure provide a system that uses thermal energy resulting from an information processing system to drive a district heating system, comprising a computer system configured to generate information; a cooling system comprising at least one manifold in thermal communication with the computer system; an elevated-low-pressure liquid-phase of the working fluid and an elevated-low-pressure vapor-phase of the working fluid; a compressor configured to extract the elevated-low-pressure vapor-phase of the working fluid from the at least one manifold to the compressor; wherein the compressor is further configured to compress the elevated-low-pressure vapor-phase of the working fluid to produce an elevated-high-pressure vapor-phase of the working fluid thereby increasing the temperature of the working fluid; a heat exchanger configured to transfer thermal energy from the elevated-high-pressure vapor-phase of the working fluid to drive a commercial process, during which the elevated-high-pressure vapor-phase of the working fluid is condensed to an elevated-high-pressure liquid-phase of the working fluid; a pressure regulator configured to reduce the pressure of the elevated-high-pressure liquid-phase of the working fluid to the elevated-low-pressure liquid-phase of working fluid, which is returned to the at least one manifold; and a controller configured to monitor and control among at least one or at least two of the computer system, the at least one manifold, the compressor, the pressure regulator, an optional phase separator, optional pumps, and the commercial process. In some cases, the disclosed computer system comprises a processor configured to mine Bitcoins. In some cases, the system is sized and dimensioned to contain at least 1 Bitcoin miner. In some cases, the system is sized and dimensioned to contain at least 2 Bitcoin miners. In some cases, the system is sized and dimensioned to contain at least 3 Bitcoin miners. In some cases, the system is sized and dimensioned to contain at least 4 Bitcoin miners. In some cases, the system is sized and dimensioned to contain at least 5 Bitcoin miners. In some cases, the system is sized and dimensioned to contain at least 6 Bitcoin miners. In some cases, the system is sized and dimensioned to contain at least 10 Bitcoin miners. In some cases, the system is configured for substantially isobaric phase change of the working fluid from the elevated-low-pressure liquid-phase of the working fluid to the elevated-low-pressure vapor-phase of the working fluid. In some cases, the compressor is configured for nearly isentropic compression of the working fluid, from the elevated-low-pressure vapor-phase of the working fluid to the elevated-high-pressure vapor-phase of the working fluid. In some cases, the heat exchanger is configured for substantially isobaric condensation of the working fluid, wherein thermal energy is transferred from the working fluid to the commercial process, resulting in at least a partial phase change of the working fluid from elevated-high-pressure vapor-phase of the working fluid to elevated-high-pressure liquid-phase of the working fluid. In some cases, the pressure regulator is configured for nearly isenthalpic pressure reduction of the working fluid from the elevated-high-pressure liquid-phase of the working fluid to the elevated-low-pressure liquid-phase of the working fluid.

In some cases, the disclosed system further comprises a controller configured to control at least three of the computer system, the compressor, the pressure regulator, optional phase separator, optional pumps, and the commercial process. In some cases, the disclosed system further comprises a controller configured to feedback to control a rate of electrical energy usage by the computer system as a function of electrical energy cost and/or computational incentives. In some cases, the pressure inside the at least one manifold is at least 1.1 atm. In some cases, the pressure inside the at least one manifold is at least 5 atm. In some cases, the pressure inside the at least one manifold is between 2 and 10 atm.

Various objects, features, aspects, and advantages of the inventive subject matter will become more apparent from the following detailed description, along with the accompanying drawing figures in which like numerals represent like components.

DETAILED DESCRIPTION

The following discussion provides many example embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Figure 1:
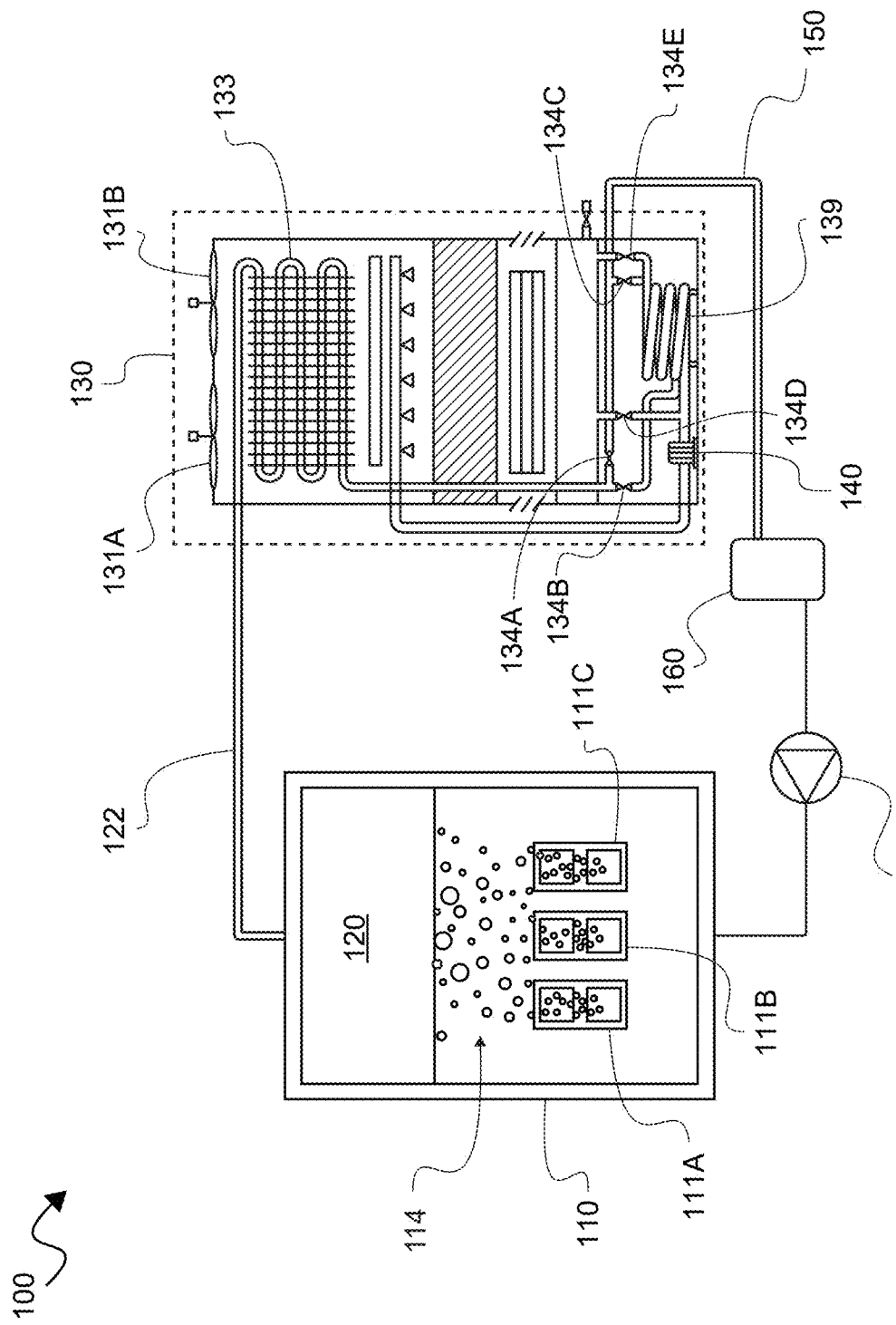
FIG. 1 is a diagram of a prior art two-phase immersion-cooling system.

In FIG. 1, a prior art two-phase immersion-cooling system 100 is used to provide cooling to crypto mining computer systems. System 100 generally includes a tank 110 that contains a working fluid 114 in which CPUs/Miners 111A, 111B, and 111C are immersed, and a headspace 120 that contains a vapor-phase of the working fluid 114. Vapor from the headspace 120 is passed to a cooling system 130 via fluid connector 122. The cooling system 130 condenses the vapor back to a liquid phase, which is then returned to the tank 110.

The cooling system 130 can be any system suited to extract thermal energy by condensing the vapor-phase of the working fluid 114 to its liquid phase. In this particular prior art embodiment, cooling system 130 generally includes fans 131A and 131B, air cooled heat exchanger 133, JT valves 134A, 134B, 134C, 134D and 134E, water-cooled heat exchanger 139 and a water pump 140. Liquid working fluid 114 passes from the cooling system 130 via fluid connector 150 to a reservoir 160, and then pumped by pump 170 to tank 110.

In the prior art system of FIG. 1, 100% of the thermal energy removed from the CPUs/Miners 111A, 111B and 111C can be rejected to the surrounding environment and subsequently wasted. Furthermore, there is an energy cost associated with removing the wasted thermal energy, wherein energy is required to drive pumps 170, fans 131A 131B.

Turning to the inventive subject matter, for the discussion herein, FIGS. 2-8, show thermodynamic states that are depicted by the numbers 1-6, CP1 and CP2, and thermodynamic processes that are denoted by letters A-D, and CP.

A working fluid can comprise any suitable composition that is sufficiently non-toxic, non-corrosive, and has a relatively low saturation temperature at atmospheric temperature (referred to here as the boiling point). In most commercially-available working fluids in computer immersion-cooling systems have a boiling point (at 1 atm) of 40° C. to 80° C. Exemplary fluids include 3M FC 72 (B.P. 56° C.), 3M FC 3284 (B.P. 49° C.), Solvay Galden HT™ 55 (B.P. 55° C.), 3M Novec 7000™ (B.P. 34° C.), 3M Novec 7100™ (B.P. 61° C.), 3M Novec 7200™ (B.P. 76° C.), Novec 649™ (B.P. 49° C.), R32, R125, R134a, R227, R-1234yf, R-1234ze, R-1234zd, and chemistries such as PFCs, HFEs, FKs, HFOs, etc.). Exemplary fluids can include suitable mixtures of two or more fluids, wherein each of the two or more fluids can have different boiling points. For the purpose here, boiling point (B.P.) refers to the saturation temperature of the working fluid at 1 atm of absolute pressure. The saturation temperature is a function of the absolute pressure.

It is contemplated that when choosing a working fluid, the dielectric constant of the fluid can be chosen to be compatible with the computer system. For example, high-performance computing may require a working fluid with a dielectric constant that is lower than what is required for Bitcoin mining.

It is contemplated that if a mixture of two or more fluids are used, the relationship between saturation pressure and saturation temperature for the mixture can be estimated by applying modified Raoult's law, wherein the partial pressure of each component of the fluids in the vapor headspace is approximately equal to the activity coefficient multiplied by the saturation pressure of the pure component multiplied by its mole fraction in solution. Dalton's law of partial pressure can be used to determine the total pressure in the vapor-phase mixture. For ideal mixtures, the activity coefficient can be assumed to be to unity. For ideal gas mixtures, the fugacity coefficient can be assumed to be unity. In some embodiments, it may be advantageous to use zeotropic mixtures of two or more working fluids. In some embodiments, it may be advantageous to use azeotropic or near-azeotropic mixtures of two or more working fluids. In some cases, two or more fluids can be incorporated, wherein the composition would have desirable vapor pressures and boiling points. In some cases, three or more fluids can be incorporated, wherein the composition would have desirable vapor pressures and boiling points. In some cases, four or more fluids can be incorporated, wherein the composition would have desirable vapor pressures and boiling points.

Figure 2A:
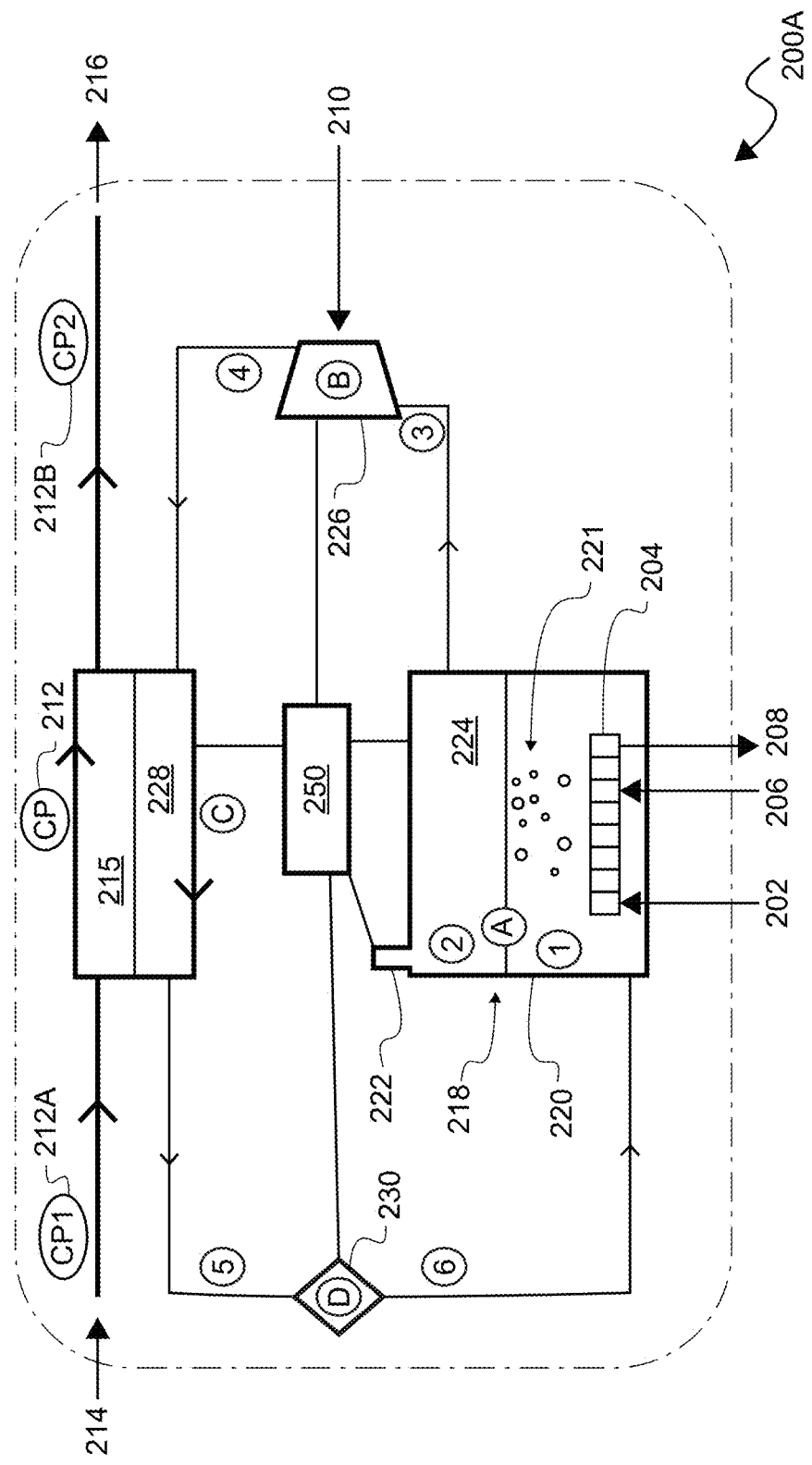
FIGS. 2A, 2B, 2C, 2D, 2E, 2F and 2G are diagrams of systems that subsidize cost of producing information by efficiently using otherwise wasted thermal energy.

FIG. 2A shows an embodiment of the inventive subject matter. System 200A produces information 208 and drives commercial process 212. System 200A receives electrical work 202, information 206, electrical work 210, and produces information 208 resulting from computations by computer system 204. Simultaneously, the thermal energy resulting from the computational process is used to drive commercial process 212. The production of commercial process 212 can help offset the input energy cost associated with electrical work 202, and electrical work 210.

Computer system 204 is contained within immersion-cooling system 218 and immersed in a suitable working fluid. The working fluid can be in a low-pressure liquid-phase at thermodynamic State 1. Electrical energy (electrical work 202) is supplied to computer system 204 to drive commercial process 212 wherein the electrical energy (electrical work 202) is converted to thermal energy. This thermal energy from computer system 204 is transferred to the low-pressure liquid-phase working fluid 221 through nucleic boiling (thermodynamic Process A), creating bubbles of low-pressure vapor-phase (State 2) working fluid 221. These vapor bubbles rise due to buoyancy into headspace 224. At least one optional boiling plate can be in thermal communication with computer system 204 and operably coupled to the working fluid (not shown in FIGS. 2A-2G) that can enhance the boiling of the working fluid during thermodynamic Process A, by providing at least one nucleation site for the boiling process. In some cases, the optional boiling plate can provide a geometric hierarchy of nucleation sites, with multiple length scales. In some cases, the optional boiling plate can be an off-the-shelf component.

As used herein, the term "standard-low-pressure" with respect to vapor-phase and liquid-phase means a pressure within 1 atmosphere ±0.5 atmospheres of absolute pressure, and the term "elevated-low-pressure" with respect to vapor-phase and liquid-phase means a pressure within 1 to 10 atmospheres of absolute pressure. As used herein, the term "low-pressure" can refer to "standard-low-pressure", or "elevated-low-pressure", or both.

As used herein, the term "standard-high-pressure" with respect to vapor-phase and liquid-phase means an absolute pressure that is at least 5% greater than the absolute pressure of the "standard-low-pressure" state, and less than 100 atmospheres of absolute pressure. Unless otherwise noted, the term "pressure" means absolute pressure. The term "elevated-high-pressure" with respect to vapor-phase and liquid-phase means an absolute pressure that is at least 5% greater than the absolute pressure of the "elevated-low-pressure" state, and less than 100 atmospheres of absolute pressure. As used herein, the term "high-pressure" can refer to "standard-high-pressure", or "elevated-high-pressure", or both.

Immersion-cooling system 218 can comprise a suitable working fluid 221, tank 220, computer system 204, headspace 224, and bellows 222. Bellows 222 can be incorporated into immersion-cooling system 218 to provide volumetric expansion of the tank 220 to help regulate a nearly constant tank pressure. The degree of bellows 222 expansion can be monitored.

Low-pressure vapor-phase working fluid 221 at thermodynamic (State 2) is directed from headspace 224, through a fluid connector to compressor 226 at State 3. Compressor 226 can compress (Process B) the low-pressure vapor-phase working fluid (State 3) to a high-pressure vapor-phase (State 4) of the working fluid 221. Compressor 226 takes in energy in the form of electrical work 210 to drive the compression (Process B).

For the inventive subject matter, in some embodiments, unless otherwise stated, liquid-phase at State 1 can comprise a compressed liquid, a saturated liquid, a superheated liquid, or even a saturated liquid-vapor mixture having a quality $x<0.5$. For the inventive subject matter, in some embodiments, unless otherwise stated, vapor-phases at State 2, State 3, and State 4 can comprise a saturated liquid-vapor mixture having a quality $x≥0.5$, a saturated vapor, or a superheated vapor; and liquid-phases at State 5 and State 6 can comprise a compressed liquid, a saturated liquid, or a saturated liquid-vapor mixture having a quality $x<0.5$.

As used herein, the term "low-quality mixture" means that vapor-phases at State 2, State 3, and State 4 can comprise a saturated liquid-vapor mixture having a quality $x≥0.25$, a saturated vapor, or a superheated vapor; and liquid-phases at State 1, State 5 and State 6 can comprise a compressed liquid, a saturated liquid, or a saturated liquid-vapor mixture having a quality $x<0.25$.

As used herein, the term "high-quality mixture" means that vapor-phases at State 2, State 3, and State 4 can comprise a saturated liquid-vapor mixture having a quality $x≥0.75$, a saturated vapor, or a superheated vapor; and liquid-phases at State 1, State 5 and State 6 can comprise a compressed liquid, a saturated liquid, or a saturated liquid-vapor mixture having a quality $x<0.75$.

Compressor 226 can be any suitable compressor that is able to produce the desired pressure ratio between State 3 and State 4, and the desired mass flow rates. Preferably, compressor 226 should be materially compatible with working fluid 221. Exemplary compressors include scroll-type compressors and reciprocal-type compressors. Exemplary compressors can also be magnetically coupled, which can help to reduce or eliminate the requirement of shaft seals in the compressor, thereby reducing fluid leakage or contamination.

It is important to note that before any resulting thermal energy from the computer system 204 is conveyed to the commercial process 212, additional energy is added to the working fluid 221 through a compression process (Process B). Compression increases both the pressure and temperature of working fluid 221. In some embodiments, Process B can be nearly isentropic. In some embodiments, Process B can be substantially isentropic.

The high-pressure vapor-phase State 4 working fluid 221 is directed to heat exchanger 228. Heat exchanger 228 could optionally be a counter-flow heat exchanger. Heat exchanger 228 can transfer thermal energy from the high-pressure vapor-phase State 4 to a commercial process fluid 215 to drive commercial process 212. In the heat exchanger 228 the working fluid 221 can undergo substantially isobaric condensation (denoted as Process C), thereby condensing the high-pressure vapor-phase (State 4) working fluid 221 to high-pressure liquid-phase (State 5) working fluid 221. Optionally, Process C can include sensible cooling of working fluid 221. In some embodiments, Process C can be nearly isobaric.

Depending upon the specific embodiment, and without departing from the scope of the inventive subject matter, working fluid 221 could experience a significant pressure drop due to viscous resistance as it flows through heat exchanger 228. Therefore, Process C could also include a pressure drop that is sufficiently large that it might not be considered substantially isobaric.

Simultaneously, commercial process 212 extracts commercial process fluid 215 from commercial process fluid source 214, and directs the commercial process fluid 215 through heat exchanger 228, and towards commercial process fluid sink 216. The commercial process fluid 215 can be driven by gravity, pump, or any other suitable means. In preferred embodiments, commercial process fluid 215 can comprise water, petroleum chemicals, alcohol, and/or other suitable commercial fluids.

The commercial process 212 can be characterized by the commercial process fluid 215 having a relatively low enthalpy (State CP1) 212A entering heat exchanger 228. The commercial process fluid 215 can then flow through heat exchanger 228, absorbing thermal energy from the high-pressure working fluid 221 through heat transfer, and exiting heat exchanger 228 at a relatively high enthalpy (State CP2) 212B, and being directed towards commercial process fluid sink 216.

Because the thermal energy in heat exchanger 228 is conveyed by heat transfer, the temperature of the incoming high-pressure vapor-phase (State 4) has a temperature that is higher than that of the desired operating temperature of commercial process 212. One primary advantage of compressing the vapor (Process B) is that it increases the temperature of the vapor from State 3 to State 4. Compressing the vapor can be advantageous over simply applying heat to the vapor to increase its temperature, because applying heat can substantially increase the entropy of the vapor, which could be disadvantageous.

Heat exchanger 228 extracts thermal energy from the high-pressure vapor (State 4) working fluid 221 to either partially condensed or fully condensed to high-pressure liquid-phase (State 5) working fluid 221. State 5 can comprise a saturated liquid-vapor mixture (quality, $x_5<0.5$), a saturated liquid, or a compressed liquid. State 5 can depend in-part on how much thermal energy is extracted by heat exchanger 228, as well as the pressure of the working fluid 221 exiting heat exchanger 228.

In some embodiments, the temperature at State 5 can be the lowest temperature state of working fluid 221. This can happen if the commercial process fluid 215 from commercial process fluid source 214 is at a lower temperature (State CP1, 212A) than the saturation temperature of the working fluid 221 (State 1, State 2) in immersion-cooling system 218. The fact that State 5 can have a lower temperature than State 6 is one of the factors that distinguish the inventive subject matter from a heat pump or refrigerator.

The high-pressure working fluid (State 5) flows through pressure regulator 230 and exists at a low-pressure (State 6), using thermodynamic Process D. If pressure regulator 230 is well insulated (idealized as adiabatic), then thermodynamic Process D can be idealized as isenthalpic. In some embodiments, Process D is substantially isenthalpic. In some embodiments, Process D is nearly isenthalpic. Depending upon the specific embodiment, pressure regulator 230 can be a passive flow restrictor, an actively-controlled flow restrictor, an off-the-shelf pressure regulator, a custom-designed pressure regulator, an expansion valve, a thermal expansion valve, a JT valve, or any other mechanism that can be used to actively or passively regulate pressure.

As will be discussed later, depending upon the temperature and pressure at State 5, and the desired pressure of low-pressure State 6, the temperature at State 6 can be higher or lower than that at State 5. For example, if State 5 is a compressed liquid with a temperature below the saturation temperature of immersion-cooling system 218, and if the liquid undergoes an ideally isenthalpic Process D, the temperature of working fluid 221 can increase, as energy is transferred from pressure energy to internal energy at nearly constant enthalpy. In this type of embodiment, the temperature of the working fluid at State 6 could be slightly higher that the temperature of the working fluid at State 5, due to viscous dissipation (which is an irreversible transfer of mechanical energy such as pressure energy to internal energy).

In yet another embodiment, if thermodynamic Process D is substantially (or nearly isenthalpic), but State 6 is a saturated liquid-vapor mixture, then the temperature at State 6 can be lower than the temperature at State 5.

After exiting pressure regulator 230, working fluid 221 at State 6 is directed to immersion-cooling system 218, where it is mixed with low-pressure liquid (State 1) of working fluid 221 in tank 220. If State 6 comprises a saturated liquid-vapor mixture, the vapor portion may separate from the liquid phase, due to buoyancy, rise vertically, and mix with low-pressure vapor (State 2).

Figure 2B:
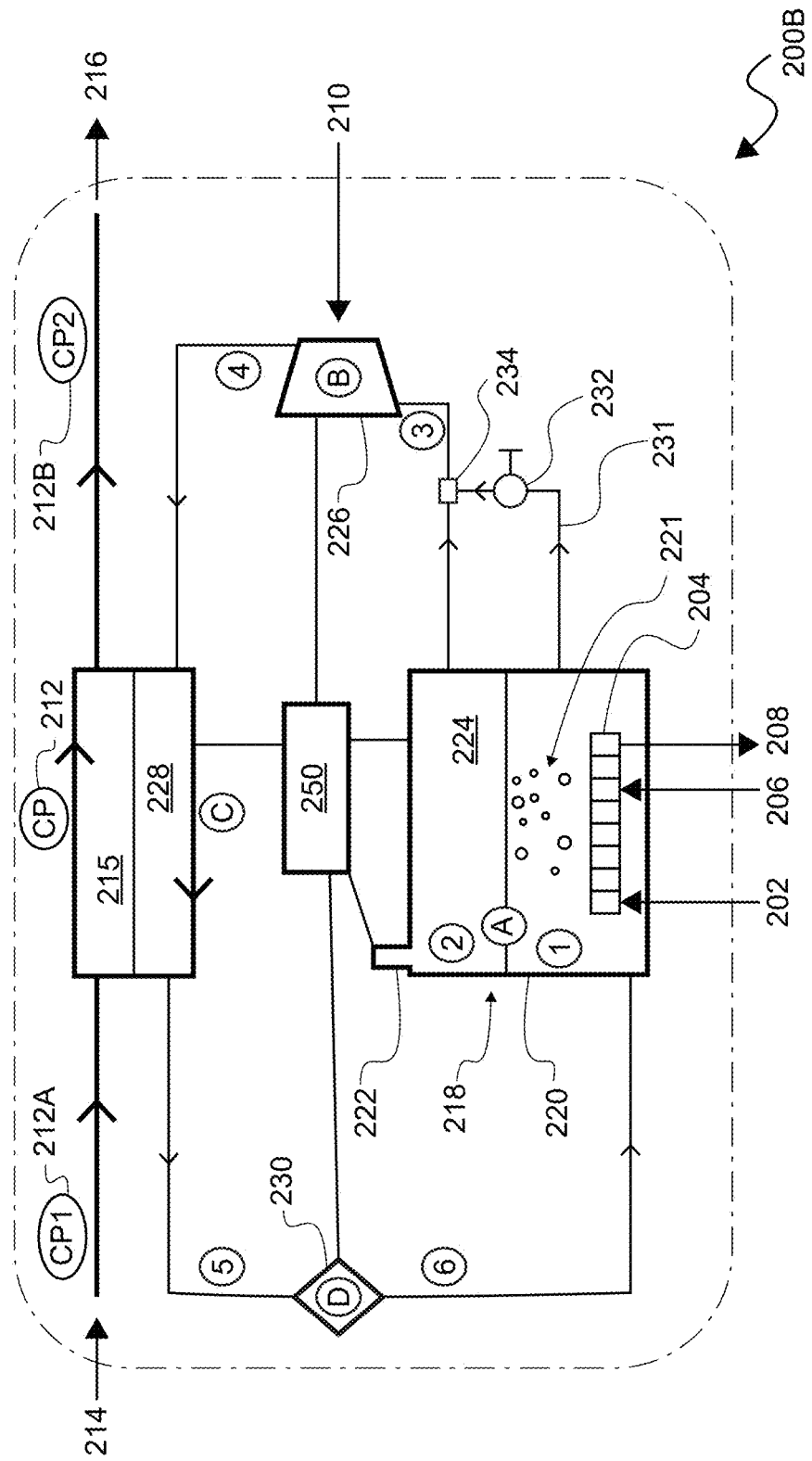

FIG. 2B shows another embodiment, where system 200B contains an optional fluid path 231 for extracting low-pressure liquid-phase (State 1) working fluid 221 from immersion-cooling system 218, and directing the low-pressure liquid-phase (State 1) through flow control device 232 towards junction 234. Flow control device 232 controls thermodynamic quality of the mixture of saturated low-pressure vapor (State 2) and low-pressure liquid-phase (State 1), which results in State 3 that flows to compressor 226.

In some embodiments, one can adjust the quality of the saturated liquid-vapor mixture (i.e. the saturated vapor mass fraction) at State 3 by manipulation of flow control device 232. It can be desirable for State 4 to be approximately a saturated vapor (i.e. quality, $x_4=1$). By adjusting the quality of the saturated mixture at State 3 going into compressor 226, one can control the quality of the high-pressure vapor exiting compressor 226. In some embodiments, State 4 could be saturated liquid-vapor mixture ($x_4>0.5$), saturated vapor, or superheated vapor. The quality at State 3 can be adjusted to produce the desired State 4, having a desired saturated pressure and quality, or a desired pressure and temperature of superheated vapor.

Another advantage to controlling the quality of the saturated liquid-vapor mixture at State 3, is that a fraction of saturated liquid entering compressor 226 can coat the surfaces of the moving parts associated with compressor 226, which can help to lubricate said moving parts.

Figure 2C:
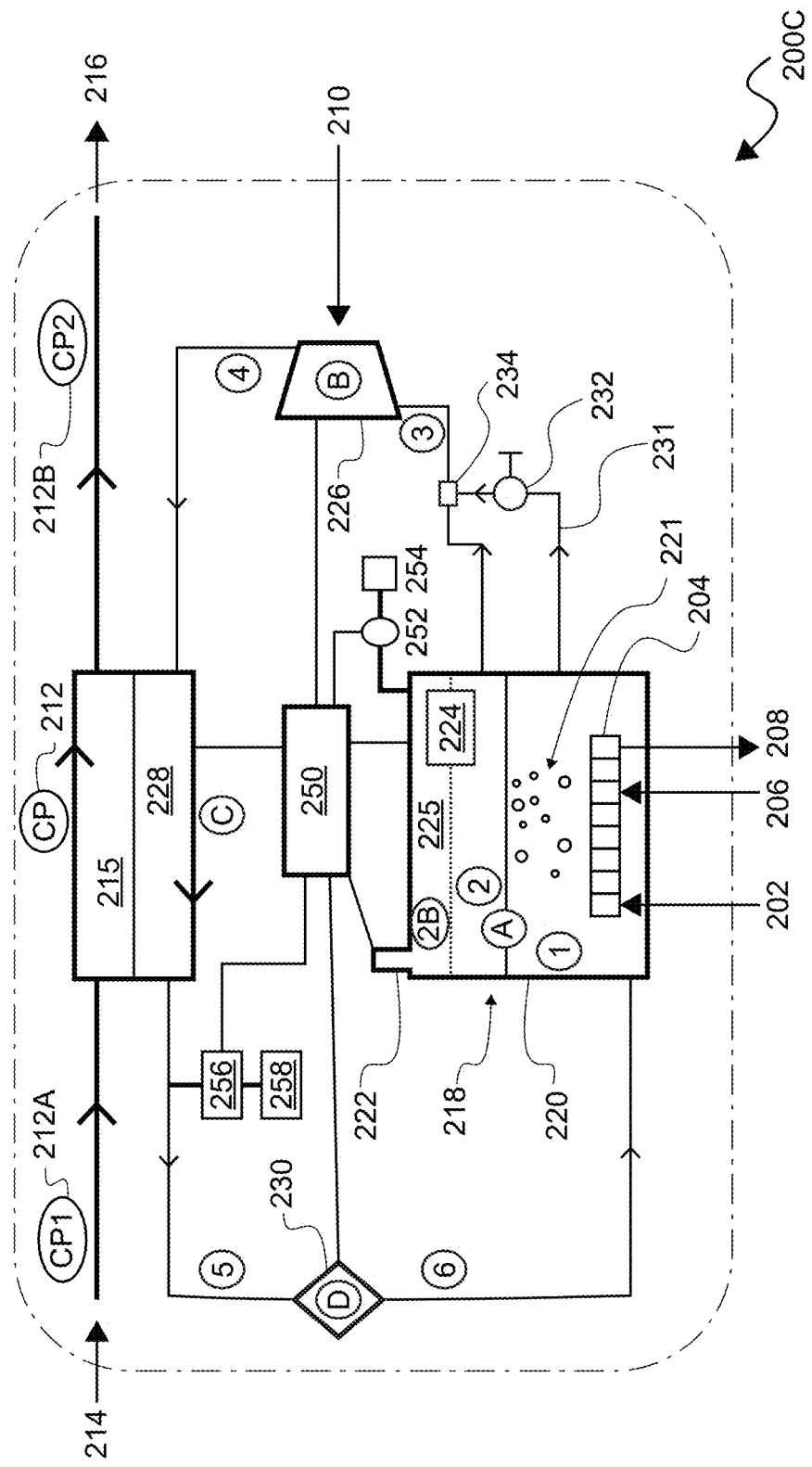

FIG. 2C shows another embodiment depicted as system 200C, wherein headspace 224 further comprises non-condensable gas 225 at State 2B. In some embodiments, it is desirable to maintain the pressure in tank 220 to be near the pressure of the atmosphere surrounding the outside of tank 220. If the temperature of working fluid 221 is below its boiling temperature then the saturation pressure (and partial pressure) of the low-pressure vapor at State 2 will be below atmospheric pressure. In this case, non-condensable gas 225 can be used to help maintain the total vapor pressure near the pressure of the atmosphere surrounding the outside of tank 220. However, during normal operation, the temperature of working fluid 221 may be near its boiling temperature, and non-condensable gas 225 may not be desirable for driving commercial process 212, and may be advantageously removed, since non-condensable gas 225 may not beneficially contribute to cooling computer system 204, or driving commercial process 212. However, when normal operation is no longer occurring, it may be desirable to return non-condensable gas 225 to tank 220.

Non-condensable gas 225 can be air, nitrogen, argon, carbon dioxide, any mixture thereof, or any other non-condensable gas. In some embodiments, it may be desirable for non-condensable gas 225 to be void of oxygen, which can help mitigate any potential flammability of the working fluid. In some embodiments, an optional compressor 252 could be used to controllably remove non-condensable gas 225 from tank 220. In some embodiments, compressor 252 could optionally be configured with a controllable valve. Optional tank 254 could be used to store non-condensable gas 225, when it is removed from tank 220. Non-condensable gas 225 can be controllably returned to tank 220 from tank 254 by reversing compressor 252. In some embodiments, non-condensable gas 225 could be vented to the surrounding atmosphere.

Some embodiments may include introducing a non-condensable gas other than ambient air into headspace 224, where the non-condensable gas has no more than 2 mol % of oxygen. In some embodiments, headspace 224 includes more than 10 mol % of a non-condensable gas other than ambient air, wherein the non-condensable gas has no more than 2 mol % of oxygen.

In some embodiments, the vapor of the working fluid 221 in headspace 224 can be more dense than non-condensable gas 225 and can form a stably stratified layer, as depicted by the dotted line shown in FIG. 2C. However, during normal operation, the dynamics of fluid motion can also cause mixing between the liquid layer, the vapor layer in headspace 224 and non-condensable gas layer 225 in headspace 224. The boundary between the low-pressure vapor at State 2 and the non-condensable gas 225 at State 2B is depicted as a dotted line because the interface is diffused with an amount of mixing.

In some embodiments, optional vents (not shown in FIG. 2C) could be added to tank 220 to provide for the removal of a first non-condensable gas 225, and replacement with a second non-condensable gas 225. For example, if the first non-condensable gas 225 is an oxygen-containing gas, such as air, it may be desirable to replace air with a gas that does not contain oxygen, such as nitrogen, argon, or carbon dioxide, or other gas that does not contain oxygen. This could help reduce flammability in the tank for some working fluids 221 that could possibly be flammable in the presence of oxygen contained within non-condensable gas 225. In some embodiments, when it is desirable to remove an oxygen-containing non-condensable gas 225, a more dense non-condensable gas 225, such as argon or carbon dioxide, may be desirable as buoyancy could be used to displace the lighter oxygen-containing gas from tank 221.

As shown in FIG. 2C, non-condensable gas 225 at State 2B in headspace 224 could be mixed with the low-pressure vapor-phase working fluid 221 at State 2, in headspace 224 and removed from tank 220, and directed to compressor 226. In this embodiment, non-condensable gas 225 could be compressed with fluid 221 in compressor 226 to State 4. The high-pressure vapor-phase working fluid 221 could be condensed in heat exchanger 228, but non-condensable gas 225 would not be condensed and would remain in a gas phase. Optional phase separator 256 could be used to separate the non-condensable gas 225 from high-pressure liquid-phase fluid at State 5. Phase separator 256 could optionally comprise a controllable valve. Once non-condensable gas 225 is separated from the high-pressure liquid-phase fluid, it could be stored in optional tank 258. Phase separator 256 could be configured to allow non-condensable gas 225 that is stored in optional tank 258 to be returned to tank 220 by reversing and allowing non-condensable gas 225 to pass through pressure regulator 230. Phase separator 256 could be any suitable phase separator that is materially compatible with working fluid 221, such as a gravity-based separator, membrane based separator (if materially compatible), centrifugal phase separator, or other type of phase separator.

Figure 2D:
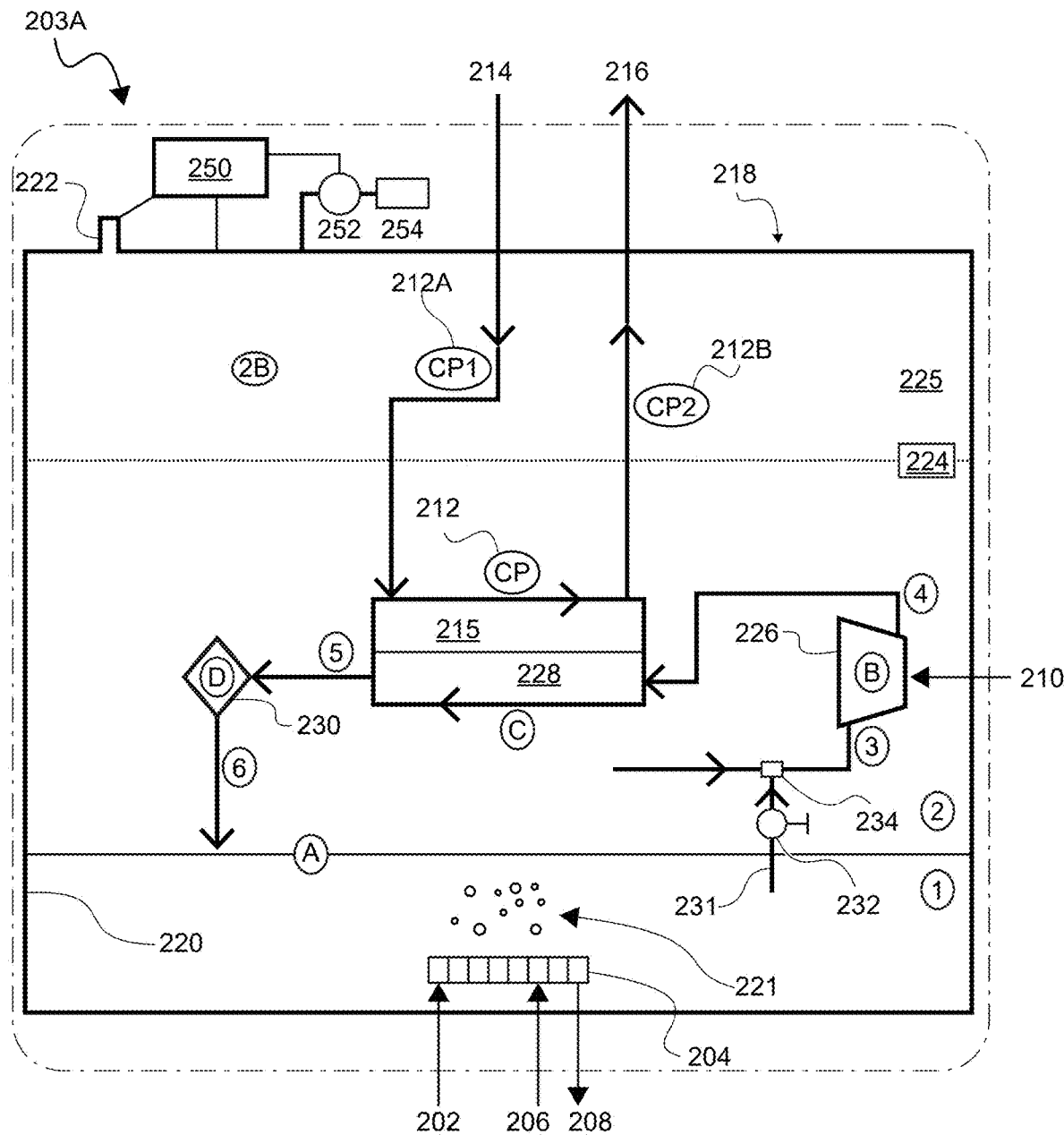

In yet another embodiment, shown in FIG. 2D, compressor 226, heat exchanger 228, and pressure regulator 230, can be disposed inside tank 220, in the vapor region of headspace 224. In yet another embodiment, shown in FIG. 2E, compressor 226, heat exchanger 228, and pressure regulator 230 are disposed inside tank 220, in the non-compressible gas 225 region of headspace 224.

Low-pressure vapor-phase of the working fluid from headspace 224 at State 2 is directed towards optional junction 234, where it could be mixed with low-pressure liquid-phase of the working fluid (State 1) passing through optional flow control device 232, which results in State 3. If no liquid is mixed at junction 232, then State 2 and State 3 are approximately the same. Once the working fluid is compressed (Process B), the high-pressure high-temperature working fluid 221 is directly towards heat exchanger 228, where it exchanges thermal energy with commercial process fluid 215, thereby driving commercial process 212. The high-pressure low-temperature working fluid (State 5) is then directed towards pressure regulator 230, where the pressure is reduced to a low-pressure and low-temperature of the working fluid (State 6) and returned to complete the thermodynamic cycle.

Figure 2E:
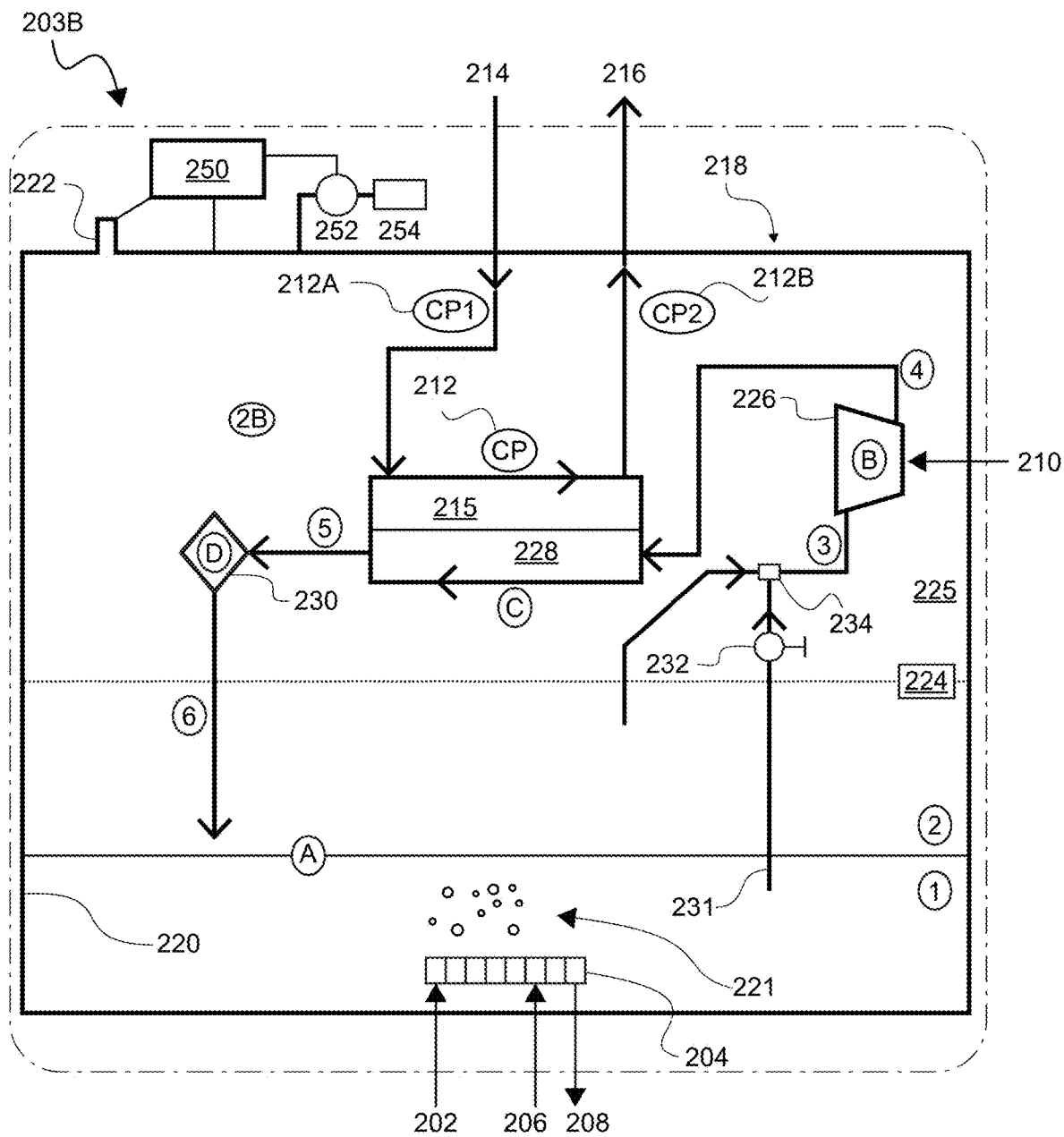

Further referring to FIGS. 2D and 2E, under normal operation, commercial process fluid 215 enters system 203A or 203B, and enters tank 220, from commercial process fluid source 214, having a relatively low enthalpy (State CP1) 212A. Commercial process fluid 215 is directed towards heat exchanger 228. Commercial process fluid 215 can then flow through heat exchanger 228, absorbing thermal energy from the high-pressure working fluid 221 through heat transfer, and exiting heat exchanger 228 at a relatively high enthalpy (State CP2) 212B. Commercial process fluid 215 exits tank 220, and can then be directed towards commercial process fluid sink 216.

One advantage to disposing compressor 226, heat exchanger 228, pressure regulator 230, and commercial process 212 inside tank 220, is that it can minimize inadvertent leaking of working fluid 221 to the surrounding atmosphere. For example, if working fluid 221 is under high pressure, it could leak from compressor 226, heat exchanger 228, pressure regulator 230 or their corresponding fluid connectors. However, by disposing these components inside tank 220, any leaking could then be recaptured by tank 220 and not released to the surrounding environment.

In some embodiments, high-pressure working fluid 221 might be at a temperature that is higher than the saturation temperature of the low-pressure working fluid 221. However, by disposing these components (i.e. compressor 226, heat exchanger 228, pressure regulator 230) in headspace 224, compressor 226 and/or heat exchanger 228, and corresponding connectors, may not exhibit significant parasitic heat loss, because the low-pressure vapor-phase (State 2) and non-condensable gas 225 (State 2B) can have relatively low thermal conductivity compared to the liquid phase.

In some embodiments, working fluid 221 could be used to lubricate the moving parts associated with compressor 226. In some embodiments, where compressor 226 is disposed inside tank 220, the vapor in headspace 224 could be used to enhance the lubrication of compressor 226.

Compressor 226 can comprise an electrical motor coupled to a compressing body. In some embodiments, compressor 226 can comprise an electrical motor coupled directly to the compressing body using a rotary shaft. In some embodiments, compressor 226 can comprise an electrical motor that is magnetically-coupled to the compressing body. If the body of tank 220 is non-magnetic, then compressor 226 could comprise an electrical motor that is disposed in close proximity to the outside of tank 220, and could be magnetically coupled to the compressing body disposed adjacent to the electrical motor, but inside tank 220.

Referring to FIGS. 2D and 2E, systems 203A and 203B can further comprise bellows 222, controller 250, optional compressor 252, and optional tank 254. Controller 250 can be operably coupled to bellows 222, optional compressor 252, and to all components disposed in tank 220.

Figure 2F:
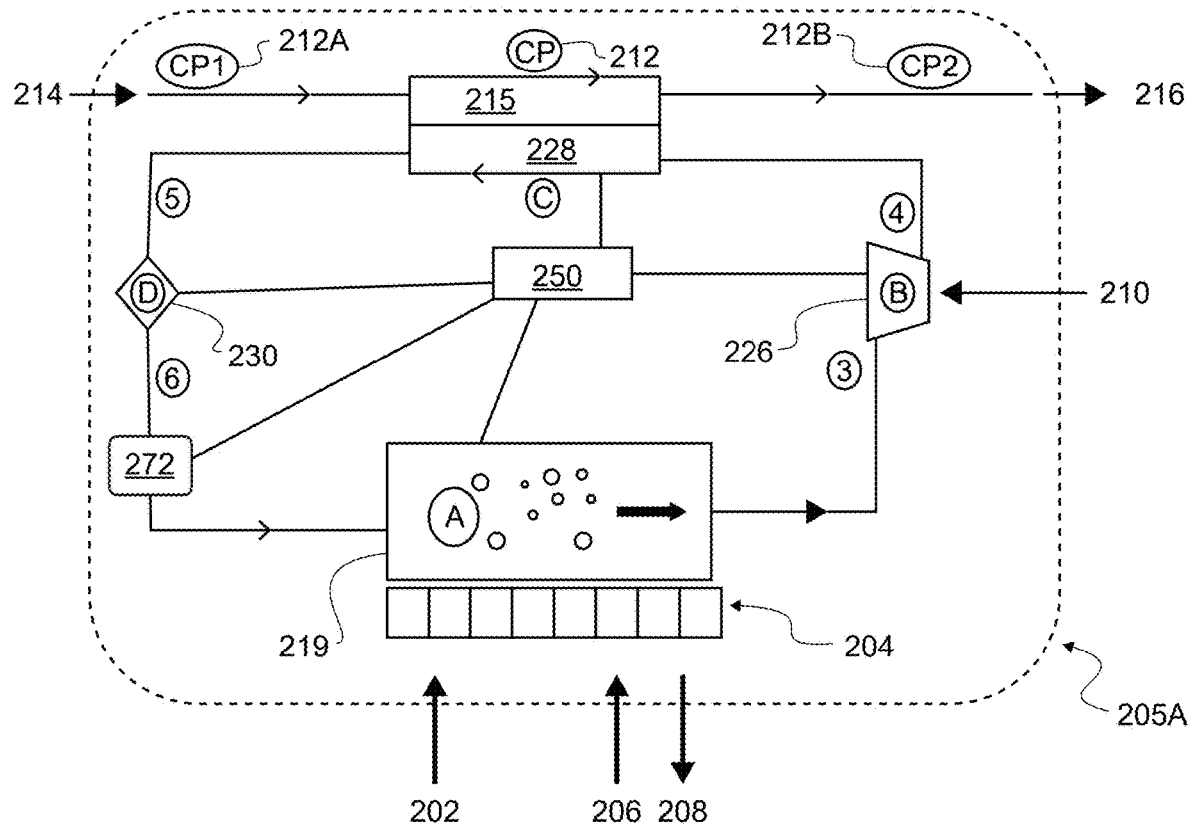

FIG. 2F shows an exemplary cooling system 205A, wherein a manifold 219 is disposed next to and in thermal communication with computer system 204. In some cases, the manifold 219 is mounted to the computer system 204. In some cases, the manifold 219 is mounted directly to the computer system 204. In some cases, the manifold 219 is coupled to the computer system 204. In some cases, an optional thermal interface material can be disposed in between the manifold 219 and the computer system 204 to enhance thermal conductance between computer system 204 and manifold 219.

Manifold 219 can be fabricated out of any suitable material that can structurally withstand the internal pressure of working fluid inside manifold 219, has sufficient highly thermal conductivity for the desired application, and does not interfere with the operation of computer system 204. Exemplary materials may include: metals such as titanium, aluminum, copper, stainless steel, and other metals, and their associated alloys; plastics; or any other suitable material.

Low-pressure working fluid at State 6 is directed into manifold 219. Thermal energy from computer system 204 is transferred by heat transfer into manifold 219, where thermal energy is transferred to the working fluid, that can sensibly heat the working fluid and/or can at least partially boil the working fluid causing a partial or complete phase change of the working fluid, through thermodynamic Process A. There can be an at least one optional boiling plate disposed inside the manifold, to enhance the boiling of the working fluid during thermodynamic Process A (not shown in FIGS. 2A-2G). The working fluid can then be directed towards compressor 226 at State 3, where it is compressed using thermodynamic Process B to State 4.

One advantage to using manifold 219 is that it could allow for a wider range of elevated-low-pressures to be used. Manifolds are known to be able to support pressures up to 10 atmospheres of absolute pressure, and even higher pressures of say 100 atmospheres could be possible with properly designed manifolds. Additional advantages to manifold 219 is that it can be configured to use a lower volume of working fluid, compared to some currently-available immersion cooling tanks. This can decrease the cost of the working fluid and decrease the environmental impact of the working fluid. Furthermore, manifold 219 can optionally be configured so that buoyancy due to gravity can be used to aid in the transport of vapor bubbles away from computer system 204 and an optional boiling plate.

In some embodiments, the working fluid can be pumped with optional pump 272. Controller 250 can be configured to control optional pump 272, manifold 219, compressor 226, heat exchanger 228, and pressure regulator 230.

Figure 2G:
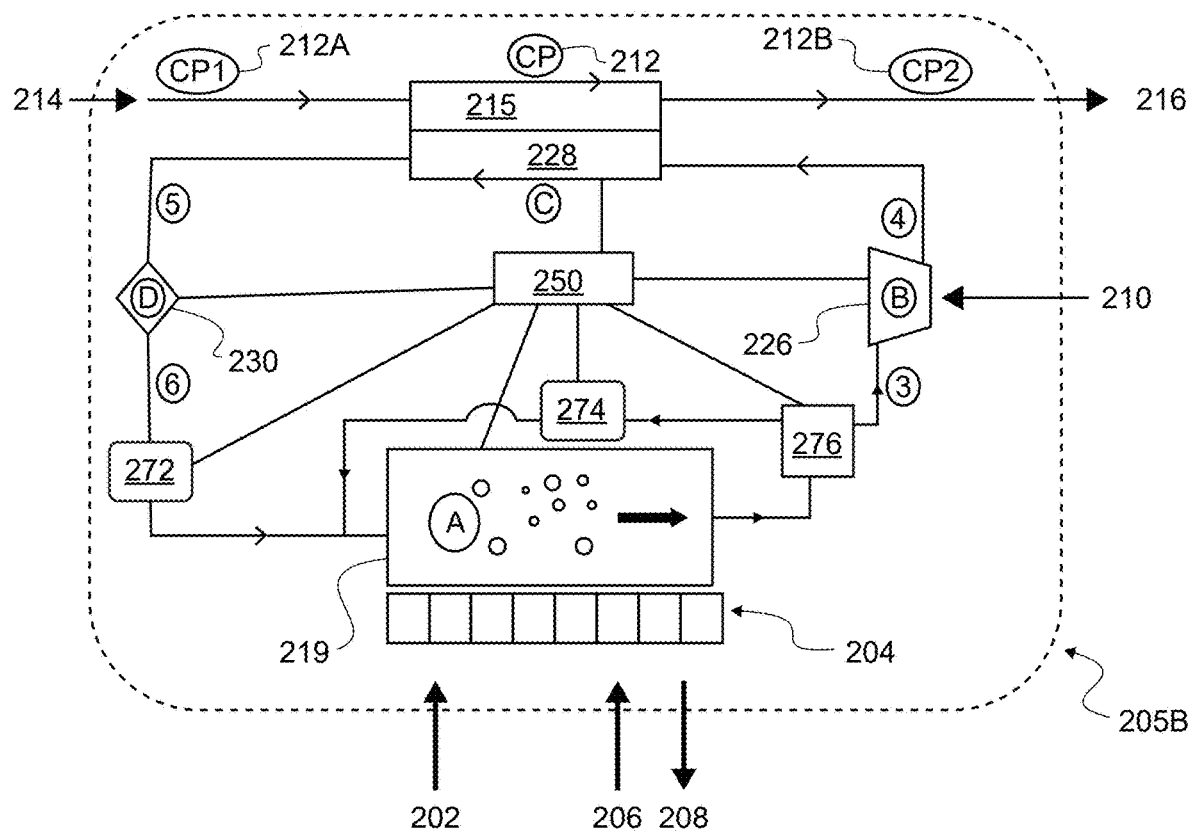

FIG. 2G shows an exemplary cooling system 205B. In this system, working fluid can be directed from manifold 219 towards an optional phase separator 276. The optional phase separator 276 can be used to further control the quality of the working fluid that can directed to compressor 226. In some embodiments, it can be advantageous to have the quality of State 3 to be near $x_3=1$. While in other embodiments, it can be advantageous to have the quality of State 3 to be less than 1. Optional phase separator 276 can be controlled by controller 250. The vapor-dominated portion of the working fluid from optional phase separator 276 can be directed to compressor 226 at State 3, while the remaining liquid-dominated portion of the working fluid can be combined with working fluid at State 6 and directed towards the inlet of manifold 219, where it can be used to remove thermal energy from computer system 204. Optional pump 274 can be used to pump the liquid-dominated portion of the working fluid from optional phase separator 276 towards the inlet of manifold 219, where it can be mixed with working fluid from pressure regulator 230, before entering manifold 219. Optional pump 272 can be used to pump working fluid from pressure regulator 230 towards the inlet of manifold 219.

Controller 250 can be used to control manifold 219, optional phase separator 276 optional pump 274, optional pump 272, compressor 226, heat exchanger 228, and pressure regulator 230.

In some cases, the presence of a small amount of water in the system could be disadvantageous, and the performance of the system could potentially be improved by having a desiccant in the system to absorb water. Without departing from the scope of the inventive subject matter, a desiccant could be disposed anywhere vapor of the working fluid or non-condensable gas 225 is present in the system, such as headspace 224.

It is contemplated that the components compressor 226, heat exchanger 228, pressure regulator 230, and commercial process 212 could be disposed anywhere inside tank 220. However, it may be advantageous to locate these components in headspace 224, as shown in FIGS. 2D and 2E.

In addition to that stated above, exemplary commercial process 212 can include distilling industrial chemicals, distilling petroleum chemicals, boiling water, distilling water, distilling water from petroleum chemicals, distilling ethyl alcohol or other alcohols, desalination of water, sensible heating of water, sensible heating of aqueous or non-aqueous mixtures, sensible heating of petroleum fluids, sensible heating of solids, heating of phase-change materials, heating for sterilization, laundry, etc.

As an illustrative embodiment, commercial process 212 could comprise boiling water at atmospheric pressure. Water has a well-known saturation temperature of $T_{sat}=100°$ C. at a pressure of $P_{sat}=1$ atm. Therefore, nucleic boiling could occur when the boiling surface temperature is in excess of the saturation temperature, and could be approximately 105-115° C., depending upon the desired heat flux (see *Fundamentals of Heat and Mass Transfer*, Incropera & DeWitt, Wiley, $5^{th}$ Ed., incorporated herein for reference). The specific heat of water is approximately $C_p=4.186$ kJ kg$^{-1}$ K$^{-1}$. The latent heat of vaporization is the energy required to cause a phase change from liquid to vapor at a specific saturation temperature. The latent heat of water is approximately $h_{fg}=2257$ kJ kg$^{-1}$. Therefore, if a mass of m=1 kg water enters systems 200A, 200B, 200C, 203A, or 203B from commercial process fluid source 214 at a temperature $T_{in}=20°$ C., it will take Q=1 kg×4.186 kJ kg$^{-1}$ K$^{-1}$ × 80 K=334 kJ of energy to heat the liquid water to $T_{sat}=100°$ C. However, to produce a phase change from saturated liquid to saturated vapor, it would take an additional 2257 kJ of energy, which is nearly 6.7 times as much energy as sensible heating from 20° C. to 100° C., bringing the total energy required to $Q_{tot}=2591$ kJ=334 kJ+2257 kJ. Furthermore, if the phase change occurs as a result of heat transfer, through heat exchanger 228, the thermal energy source would need to be at a temperature in excess of $T_{sat}=100°$ C.

A prior art cooling system, such as immersion-cooling system 100 might not be able to efficiently drive a commercial process, because the temperature of the vapor-phase working fluid exiting the tank is too low. For example, in a typical system such as that shown in FIG. 1, the saturated vapor-phase working fluid 114 would exit headspace 120 at a temperature of perhaps 40° C.-80° C. (depending upon the saturation temperature of working fluid). Using Novec 7200 (or similar fluid) as the working fluid with a saturation temperature of 76° C., the working fluid vapor could only be used to heat a commercial process fluid to a maximum of 76° C. If the commercial process fluid is water, and the commercial process requires boiling m=1 kg of water, then the working fluid could supply at most Q=m x Cp×ΔT=1 kg×4.186 kJ kg$^{-1}$ K$^{-1}$×(76−20) K=234 kJ. This is approximately 9% (=234/2591) of the total 2591 kJ of energy required to boil water at atmospheric pressure with an initial temperature of 20° C. This low efficiency of 9% may not be desirable for subsidizing the energy of a commercial process, and further illustrates the longstanding problem that the computing industry, and Bitcoin mining industry in particular, has been unable to solve.

In contrast, in embodiments of the inventive subject matter, the pressure at State 4 and State 5 can be sufficiently high that the saturation temperature of the working fluid exceeds the maximum desired temperature of the commercial process fluid 215, and no additional energy source would be required.

In an illustrative example of commercial process 212 being directed towards boiling water starting at 20° C. and 1 atm of pressure, one could choose Novec 7200 (or similar type of fluid) as the working fluid. The low-pressure vapor-phase at State 3 could have a saturation pressure of $P_3=1$ atm, and a saturation temperature of $T_3=76°$ C. Compressor 226 could compress the fluid to approximately to a temperature of say $T_4=112°$ C. (selecting an excess boiling temperature of 12° C.). The saturation pressure of Novec 7200 can be estimated using Antoine's equation, where $\ln(P_{sat})=22.289-3752.1/T_{sat}$, where the unit of pressure is Pa and the unit of temperature is K. The pressure for State 4 and State 5 can be estimated to be approximately $P_4=P_5=2.80$ atm (corresponding to a saturation temperature of $T_4=112°$ C.).

If we assume that water enters the commercial process 212 at an initial temperature of 20° C., we could realistically assume that the water could completely condense the working fluid, and also sensibly cool the high-pressure liquid-phase working fluid 221 to a compressed liquid with a temperature of, for example, 32° C. (State 5). (Note: the water could potentially cool the working fluid to an even lower temperature, but we will use 32° C. as a reasonable value for this illustrative example.). Assuming an isentropic compression process B, we roughly estimate that it could take approximately We=3 kJ mol$^{-1}$ of electrical work to compress the working fluid from State 3 ($T_3=76°$ C., $P_3=1$ atm) to State 4 ($T_4=112°$ C., $P_4=2.8$ atm), producing a quality of approximately $x_4=0.78$ (calculation not shown). We further roughly estimate that about Q=47 kJ mol$^{-1}$ of thermal energy of working fluid 221 could be transferred through heat exchanger 228 to commercial process 212 directed towards heating and boiling water.

Focusing on commercial process 212, the water can be completely boiled by repurposing the resulting thermal energy from computer system 204, adding approximately 3 kJ of electrical work to compressor 226. Thermodynamic systems 200A, 200B, 200C, 203A, or 203B could release approximately 47 kJ of thermal energy, with much of that thermal energy being transferred at an approximate saturation temperature of $T_4=112°$ C. to boil the water. (calculation not shown). The coefficient of performance for commercial process 212 of systems 200A, 200B, 200C, 203A, 203B, 205A, or 205B could be approximately $COP_{CP}$=Desired Output/Required Input=47/3=15.6. (Note: the required electrical work energy supplied to compressor 226 and thermal energy released to heat/boil water are approximate and presented here for illustrative purposes only. The actual implementation of compressor 226 can vary significantly, depending upon the efficiency of the specific type of compressor, or if multistage compressors are used, or if heat is transferred to the surrounding environment, etc. Furthermore, the amount of thermal energy extracted working fluid 221 in heat exchanger 228 could vary significantly, and the amount is approximate).

For this illustrative embodiment, 200A, 200B, 200C, 203A, 203B, 205A, or 205B could potentially provide an approximately 93% (0.93=1−1/15.6) reduction in energy that would otherwise be required to boil water. This approximately 93% reduction in energy that would otherwise be required to operate commercial process 212 could solve a longstanding problem in the high-performance computing industry and Bitcoin mining industry, where it is desirable to efficiently repurpose the resulting thermal energy for a commercial process to help offset the energy costs associated with large-scale computations.

In some embodiments, the working fluid can have a saturation temperature at atmospheric pressure in immersion-cooling system 218 or manifold-cooling system 219 of 40° C. to 85° C., inclusive, and more preferably 50° C. to 80° C., inclusive.

In some embodiments, compressor 226 can compress the working fluid from a low-pressure State 3 to high-pressure State 4, thereby increasing the temperature between State 3 and State 4 by 75° C.-100° C., inclusive.

In some embodiments, compressor 226 can compress the working fluid from a low-pressure State 3 to high-pressure State 4, thereby increasing the temperature between State 3 and State 4 by 1° C.-25° C., inclusive.

In some embodiments, compressor 226 can compress the working fluid from a low-pressure State 3 to high-pressure State 4, thereby increasing the temperature between State 3 and State 4 by 25° C.-75° C., inclusive.

In some embodiments, compressor 226 can compress the working fluid from a low-pressure State 3 to high-pressure State 4, thereby increasing the temperature between State 3 and State 4 by 35° C.-55° C., inclusive.

In some embodiments, compressor 226 can compress the working fluid from a low-pressure State 3 to high-pressure State 4, wherein the temperature of State 4 is 80° C.-110° C., inclusive.

In some embodiments, compressor 226 can compress the working fluid from a low-pressure State 3 to high-pressure State 4, wherein the temperature of State 4 is 110° C.-125° C., inclusive.

In some embodiments, compressor 226 can compress the working fluid from a low-pressure State 3 to high-pressure State 4, wherein the temperature of State 4 is 125° C.-160° C., inclusive.

In yet another illustrative embodiment, commercial process 212 could be sensible heating of water or an aqueous mixture. For example, commercial process 212 could be a district heating system. As used herein, the term "district heating" means distributing heat generated in a centralized location through a system of insulated pipes for residential and/or commercial heating requirements. This can be done by sensibly heating water in a centralized location. Once the water is heated to a desired temperature, the water is distributed to one or more buildings, where the heated water is used to heat the interior of one or more buildings, or optionally heat a secondary water supply for dishes, bathing, or for other purposes. District heating can be used for both commercial buildings and/or residential buildings. In some embodiments, it may be desirable to sensibly heat water to approximately 80° C.-90° C. In some embodiments, it may be desirable to sensibly heat water to approximately 60° C.-90° C. After the water exchanges heat in one or more buildings, the temperature of the water is lower, and it can be returned to the centralized location, where the cycle can be repeated. The return temperature can be anywhere from approximately 5-30° C. (and even 30-60° C. in some applications) below its initially-heated temperature. The temperature ranges shown here are for illustrative purposes. Other temperature ranges can occur without departing from the scope of the inventive subject matter.

In another illustrative embodiment, commercial process 212 could comprise sensibly heating water (commercial process fluid 215) from a return temperature of 60° C. (State CP1, 212A) to a higher temperature of 80° C. (State CP2, 212B). In order to efficiently exchange heat between high-pressure working fluid 221 and commercial process fluid 215, for illustrative purposes herein, let's assume a temperature difference across heat exchanger 228 of 10° C. As a result, the desired temperature of working fluid 221 at State 4 could be $T_4=90°$ C., and State 5 could be $T_5=70°$ C.

Novec 7100 could be used as an illustrative commercially-available working fluid 221. Novec 7100 has a saturation temperature of $T_1=T_2=61°$ C. (1 atmosphere of pressure). Novec 7100 (using a reference state of saturated liquid, x=0, T=250 K) vapor at State 2 (enthalpy $h_2=h_3=51.3$ kJ/mol) could be removed from tank 220 and directed to compressor 226, where it could be isentropically compressed to an absolute pressure of $P_4=2.5$ bar, reaching a saturation temperature of $T_4=90°$ C. and enthalpy $h_4=53.2$ kJ/mol (quality $x_4=0.82$, calculation not shown). The high-pressure Novec 7100 could then exchange heat in heat exchanger 228, transferring enthalpy to water (commercial process fluid 215), condensing to a saturated liquid, and further sensibly cooling working fluid 221 to $T_5=70°$ C., corresponding to an enthalpy $h_5=26.4$ kJ/mol. The coefficient of performance of commercial process 212, for this illustrative embodiment, can be estimated as:

$$COP_{CP} = \frac{h_4 - h_5}{h_4 - h_3} = \frac{53.2 - 26.4}{53.2 - 51.3} = 14.1$$

In yet another illustrative embodiment, Novec 7200 could be used as an illustrative commercially-available working fluid 221. Novec 7200 has a saturation temperature of $T_1=T_2=76°$ C. (1 atmosphere of pressure). Novec 7200 (using a reference state of saturated liquid, x=0, T=273 K) vapor at State 2 (enthalpy $h_2=h_3=52.5$ kJ/mol) could be removed from tank 220 and directed to compressor 226, where it could be isentropically compressed to an absolute pressure of $P_4=1.85$ bar, reaching a saturation temperature of $T_4=90°$ C. and enthalpy $h_4=54.7$ kJ/mol (quality $x_4=0.92$, calculation not shown). The high-pressure Novec 7200 could then exchange heat in heat exchanger 228, transferring enthalpy to water (commercial process fluid 215), condensing to a saturated liquid, and further sensibly cooling working fluid 221 to $T_5=70°$ C., corresponding to an enthalpy $h_5=21$ kJ/mol. The coefficient of performance of commercial process 212, for this illustrative embodiment, can be estimated as:

$$COP_{CP} = \frac{h_4 - h_5}{h_4 - h_3} = \frac{54.7 - 21}{54.7 - 52.5} = 15.3$$

It is contemplated that the coefficient of performance for commercial process 212, defined herein as the desired commercial energy output divided by the required additional energy input, can vary depending upon the choice of working fluid 221 and commercial process 212, and the choice of compression ratio selected for compressor 226. It is further contemplated that the coefficient of performance values disclosed are for illustrative purposes, and actual values in practice may vary, and could be larger or smaller.

In some embodiments, controller 250 can be used to monitor and control at least two of the computer system 204, tank 220, operation of bellows 222, compressor 226, optional compressor 252, optional phase separator 256, pressure regulator 230, and commercial process 212. In some embodiments, controller 250 can use feedback control and/or feedforward control.

For example, when the bellows 222 expand beyond a preset amount, controller 250 can adjust pressure regulator 230 and/or compressor 226 to reduce a pressure of the low-pressure liquid phase (State 6) of the working fluid 221 returning to the tank 220.

In another example, when commercial process 212 requires a higher temperature of the high-pressure vapor-phase (State 4), controller 250 can adjust operation of the pressure regulator 230 and/or compressor 226 to adjust State 4.

In another example, controller 250 can control a mass flow rate of the commercial process 212 as a function of the thermal energy produced by the computer system 204.

In yet another example, controller 250 can control the rate of electrical energy usage by the computer system 204 as a function of electrical energy cost and/or computational incentives.

FIGS. 3A, 3B, 3C, and 3D are exemplary thermodynamic process (pressure-enthalpy) diagrams for when the compression process (Process B) produces a saturated liquid-vapor mixture that can be achieved with systems 200A, 200B, 200C, 203A, and 203B.

Figure 3A:
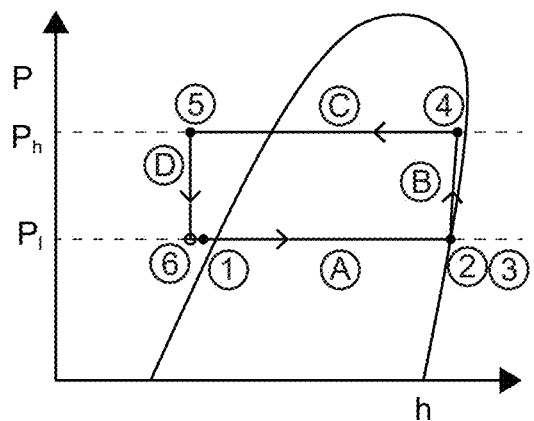
FIGS. 3A, 3B, 3C, and 3D are exemplary thermodynamic process (pressure-enthalpy) diagrams for when the compression process produces a saturated liquid-vapor mixture.
Figure 3B:
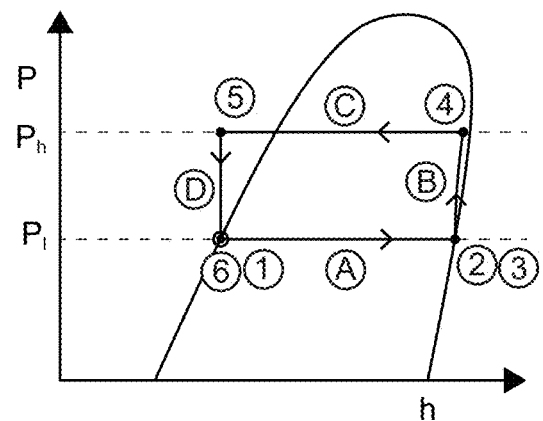
Figure 3C:
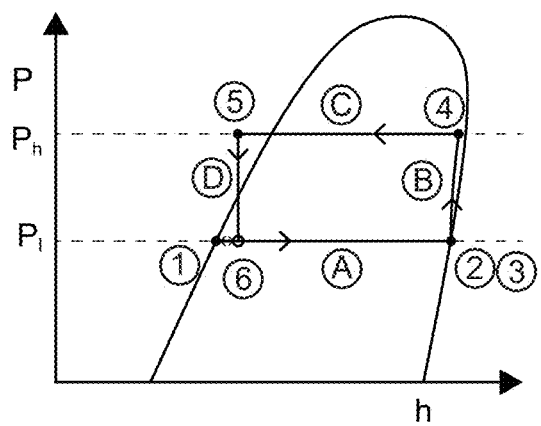
Figure 3D:
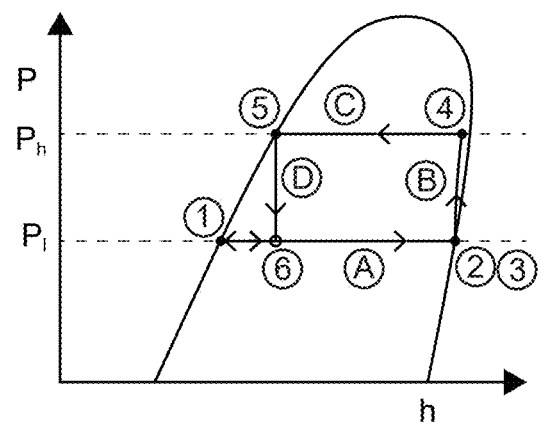

In FIGS. 3A and 3B, State 5 can be at a lower temperature than State 6. In FIG. 3A, State 6 is a compressed liquid. When the compressed liquid enters tank 220, it is mixed with the low-pressure liquid residing tank 220, wherein State 1 could be a compressed liquid that is closer to the saturation line than the liquid at State 6. FIG. 3B shows State 6 as a low-pressure saturated liquid, and is approximately the same state as State 1. FIG. 3C shows State 6 as a liquid-vapor mixture. When fluid at State 6 enters the tank, it could separate into its liquid and vapor components, contributing mass that is low-pressure saturated-liquid (State 1) and low-pressure saturated-vapor (State 2). FIG. 3D shows State 6 as a liquid-vapor mixture. When fluid at State 6 enters the tank, it could separate into its liquid and vapor components, contributing mass that is low-pressure saturated-liquid (State 1) and low-pressure saturated-vapor (State 2).

FIGS. 4A, 4B, 4C, and 4D are exemplary thermodynamic process (pressure-enthalpy) diagrams for when the compression process (Process B) produces superheated vapor that can be achieved with systems 200A, 200B, 200C, 203A, and 203B.

Figure 4A:
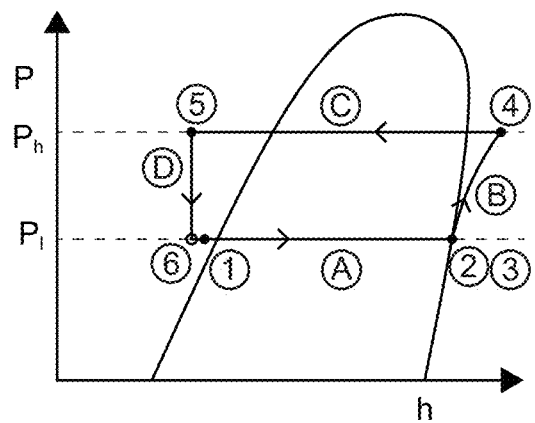
FIGS. 4A, 4B, 4C, and 4D are exemplary thermodynamic process (pressure-enthalpy) diagrams for when the compression process produces superheated vapor.
Figure 4B:
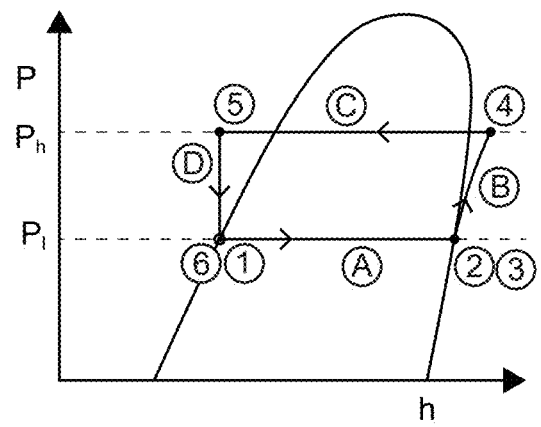
Figure 4C:
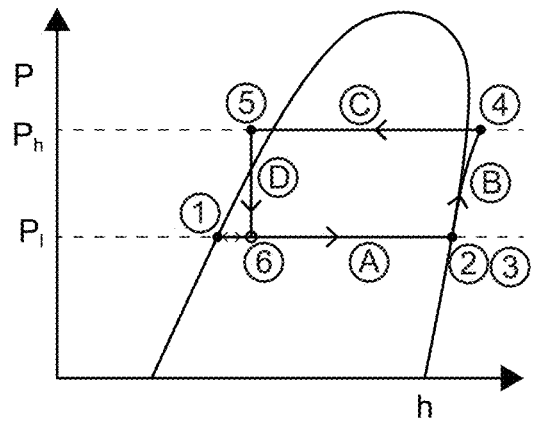
Figure 4D:
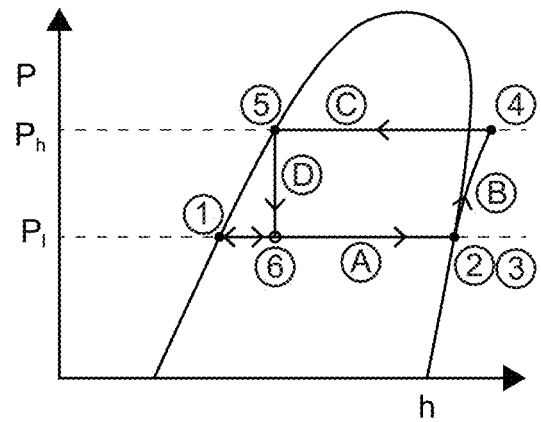

In FIGS. 4A and 4B, State 5 can be at a lower temperature than State 6. In FIG. 4A, State 6 is a compressed liquid. When the compressed liquid enters tank 220, it is mixed with the low-pressure liquid residing tank 220, wherein State 1 could be a compressed liquid that is closer to the saturation line than the liquid at State 6. FIG. 4B shows State 6 as a low-pressure saturated liquid, and is approximately the same state as State 1. FIG. 4C shows State 6 as a liquid vapor mixture. When fluid at State 6 enters the tank, it could separate into its liquid and vapor components, contributing mass that is low-pressure saturated-liquid (State 1) and low-pressure saturated-vapor (State 2). FIG. 4D shows State 6 as a liquid vapor mixture. When fluid at State 6 enters the tank, it could separate into its liquid and vapor components, contributing mass that is low-pressure saturated-liquid (State 1) and low-pressure saturated-vapor (State 2).

FIGS. 5A, 5B, 5C, and 5D are exemplary thermodynamic process (pressure-enthalpy) diagrams for when the compression process produces saturated vapor that can be achieved with system 201. In these diagrams, saturated low-pressure vapor (State 2) is mixed with saturated low-pressure liquid (State 1) to obtain saturated liquid-vapor mixture (State 3), before it is compressed (Process B).

Figure 5A:
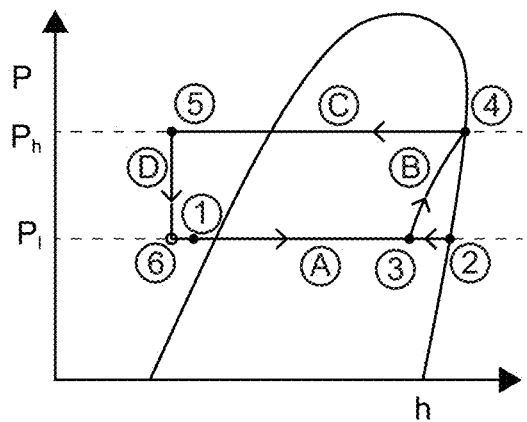
FIGS. 5A, 5B, 5C, and 5D are exemplary thermodynamic processes (pressure-enthalpy) diagrams for when the compression process produces saturated vapor.
Figure 5B:
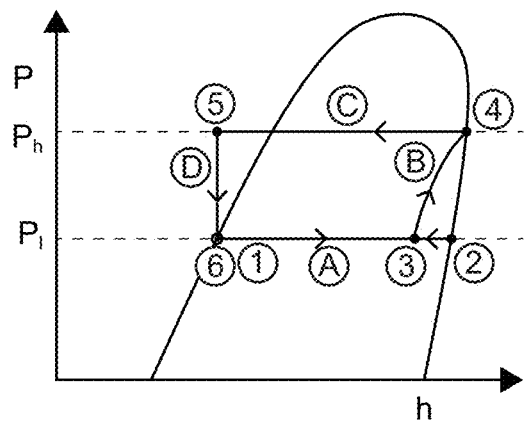
Figure 5C:
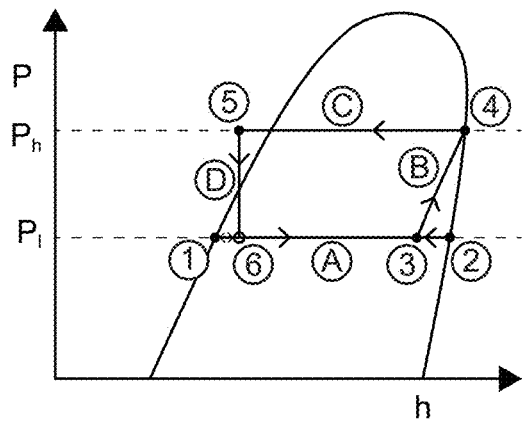
Figure 5D:
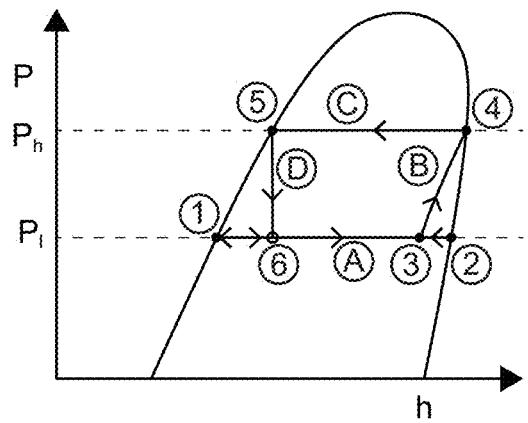

In FIGS. 5A and 5B, State 5 can be at a lower temperature than State 6. In FIG. 5A, State 6 is a compressed liquid. When the compressed liquid enters tank 220, it is mixed with the low-pressure liquid residing tank 220, wherein State 1 could be a compressed liquid that is closer to the saturation line than the liquid at State 6. FIG. 3B shows State 6 as a low-pressure saturated liquid, and is approximately the same state as State 1. FIG. 5C shows State 6 as a liquid-vapor mixture. When fluid at State 6 enters the tank, it could separate into its liquid and vapor components, contributing mass that is low-pressure saturated-liquid (State 1) and low-pressure saturated-vapor (State 2). FIG. 5D shows State 6 as a liquid-vapor mixture. When fluid at State 6 enters the tank, it could separate into its liquid and vapor components, contributing mass that is low-pressure saturated-liquid (State 1) and low-pressure saturated-vapor (State 2).

FIGS. 6A, 6B, 6C, 6D, and 6E are exemplary thermodynamic process (pressure-enthalpy) diagrams for commercial processes 212 (isobaric) that could be driven by the inventive subject matter.

Figures 6A, 6B, 6C, 6D, 6E:
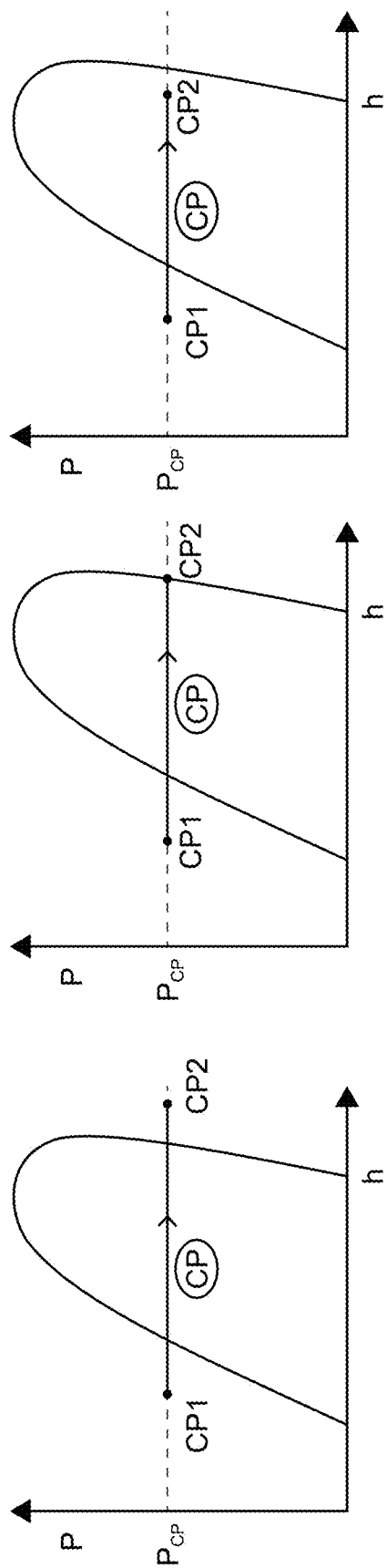
FIGS. 6A, 6B, 6C, 6D, and 6E are exemplary thermodynamic process (pressure-enthalpy) diagrams for commercial processes that could be driven by the inventive subject matter.

FIGS. 6A and 6B show a phase change of the commercial process fluid between States CP1 and CP2.

FIG. 6C shows a partial phase change of the commercial process fluid between States CP1 and CP2.

FIGS. 6D and 6E show sensible heating of the commercial process fluid between States CP1 and CP2.

Figure 7:
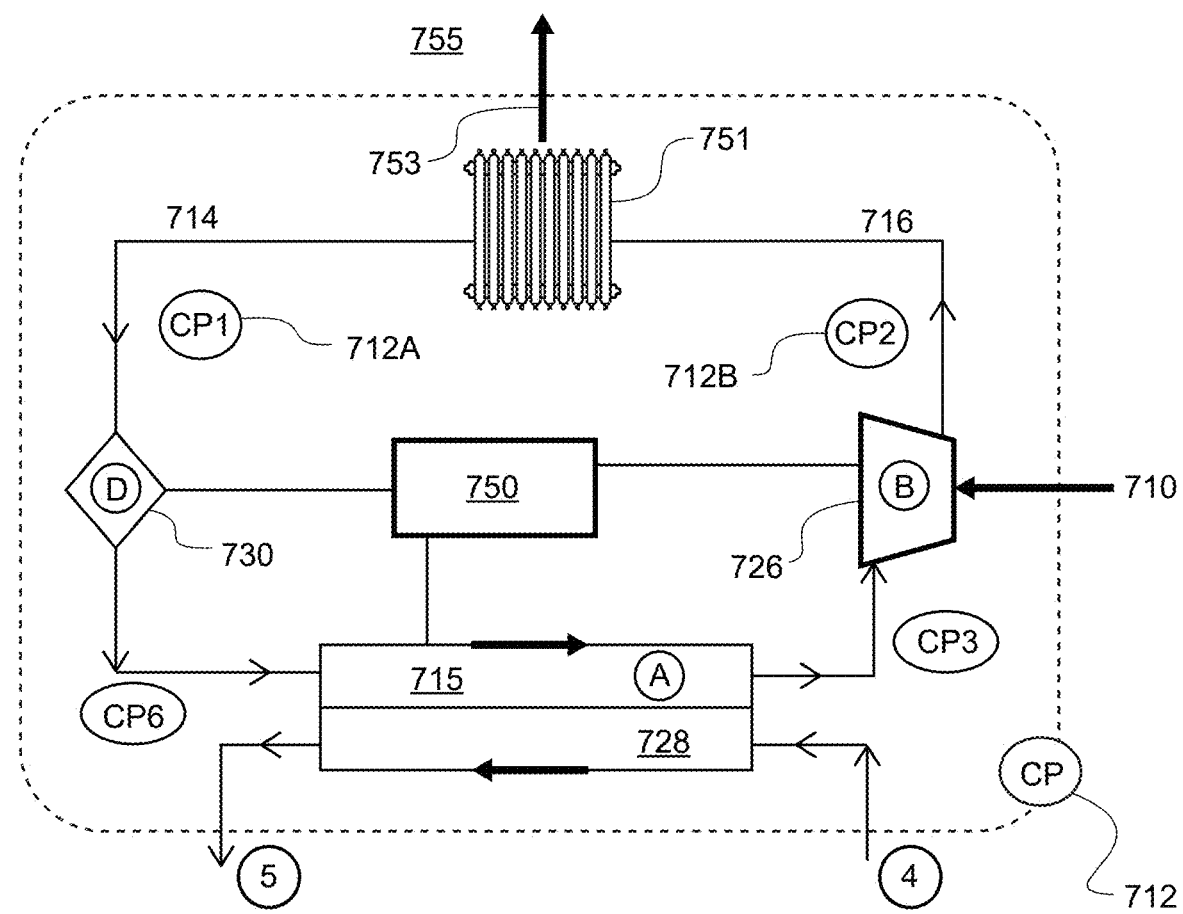
FIG. 7 is a diagram depicting an illustrative embodiment of a commercial process to subsidized cost of producing information by efficiently using otherwise wasted thermal energy.

FIG. 7 shows an illustrative embodiment of a commercial process (CP) 712. In this illustrative embodiment, working fluid at State 4 is received from a compressor and directed to heat exchanger 728. The heat exchanger 728 allows transfer of thermal energy from the working fluid to commercial process fluid 715. The lower enthalpy working fluid at State 5 is then returned to a pressure regulator. Without loss of generality commercial process fluid 715 can be any refrigerant, water, or other fluid can be at least partially vaporized in heat exchanger 728 to State CP3. In heat exchanger 728, commercial process fluid 715 increases the enthalpy from state CP 6 to state CP 3. Commercial process fluid 715 at State CP3 can be directed towards compressor 726. Electrical work 710 can be used to power compressor 726, and compress commercial process fluid 715 to higher pressure and temperature at State CP2 (depicted as 712B). The compression process B can increase the temperature and pressure of commercial process fluid 715, to a desired level, enhancing the usability of commercial process 712. In some embodiments, compression process B can be nearly isentropic. In some embodiments, compression process B can be substantially isentropic. Commercial process fluid 715 at State CP2 can be directed to 716. In this illustrative example, radiator 751 receives high-enthalpy commercial process fluid 715 at State CP 2 from 716, and radiates thermal energy 753 to the surrounding environment 755, thereby reducing the enthalpy of commercial process fluid 715 from State CP2 (depicted as 712B) to State CP1 (depicted as 712A). The commercial process fluid 715 can then be directed from radiator 751 to 714, and then to pressure regulator 730. The commercial process fluid 715 can be expanded during process D to state CP6 and returned to heat exchanger 728. Commercial process 712 can be controlled by controller 750. In some embodiments, Process D can be nearly isenthalpic. In some embodiments, Process D can be substantially isenthalpic. In some cases, it is contemplated that radiator 751 can provide heating to commercial or residential buildings.

Without loss of generality, and depending upon the specific application and choice of commercial process fluids 715, commercial process 712 can consist of multiple compression stages 726, and multiple expansion stages 730. The optional multiple compression and expansion stages may be chosen is improve performance and efficiency.

Figure 8:
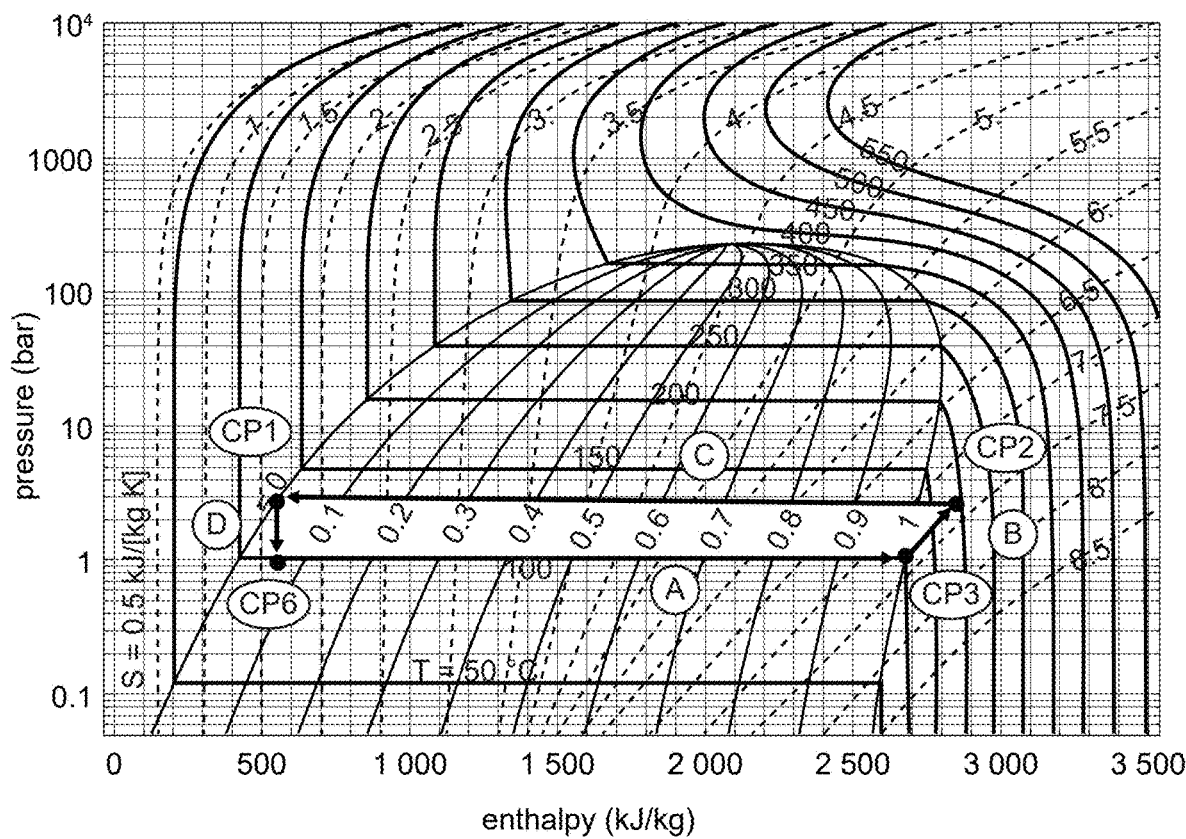
FIG. 8 is an exemplary thermodynamic process (pressure-enthalpy) diagram of a commercial process.

FIG. 8 shows an exemplary commercial process (pressure-enthalpy diagram), wherein the commercial process fluid is chosen to be water for illustrative purposes. However, as mentioned earlier, the commercial process fluid could be any suitable phase-change fluid, such as a refrigerant. In this illustrative example, liquid water is phase-changed at 1 atmosphere of absolute pressure from State CP6 to State CP3 through an ideally constant pressure process A going from an enthalpy $h_{CP6}$=419 kJ/kg to $h_{CP3}$=2675 kJ/kg. In this exemplary commercial process, commercial process fluid is ideally compressed isentropically through process B from a pressure of 1 bara to a pressure of 2.7 bara, which produces superheated steam with temperature of 200 C, and a saturation temperature of 130 C at state CP2, raising the enthalpy to $h_{CP2}$=2733 kJ/kg. In this exemplary commercial process, the commercial process fluid can then exchange heat during the commercial process (process C) at ideally constant pressure to state CP1, where the enthalpy is reduced to $h_{CP1}$=546 kJ/kg. In this exemplary commercial process, the commercial process fluid is then directed to a pressure regulator where it is ideally expanded isenthalpically during process D, to state CP6.

The coefficient of performance for this exemplary commercial process is defined as the ratio of the desired output divided by the required input, so that $$COP_{CP} = \frac{h_{CP_2} - h_{CP_1}}{h_{CP_2} - h_{CP_3}} = \frac{2733 - 546}{2733 - 2675} = 38.$$

In other words, ideally, it would only take one unit of additional energy to produce 38 units of energy at an increase in saturation temperature to 130° C. There are certainly commercial processes where it may be advantageous to use steam at 130° C., compared to only 100° C.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps can be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

The invention claimed is:

1. A method of subsidizing a cost of providing information, comprising:
    providing a cooling system comprising at least one manifold, wherein the at least one manifold is in thermal communication with a computer system, wherein an elevated-low-pressure liquid-phase of a working fluid flows through the at least one manifold, and wherein the computer system providing the information;
    directing an elevated-low-pressure vapor-phase of the working fluid from the at least one manifold to a compressor;
    compressing the elevated-low-pressure vapor-phase of the working fluid to produce an elevated-high-pressure vapor-phase of the working fluid, wherein the temperature of the working fluid is increased during the compressing process;
    utilizing the elevated-high-pressure vapor-phase of the working fluid in a heat exchanger to operate a commercial process, during which the elevated-high-pressure vapor-phase of the working fluid is condensed to an elevated-high-pressure liquid-phase of the working fluid;
    reducing a pressure of the elevated-high-pressure liquid-phase of the working fluid to produce an elevated-low-pressure liquid-phase of the working fluid;
    returning the elevated-low-pressure liquid-phase of the working fluid to the at least one manifold; and
    monitoring and controlling among at least one of the computer system, the compressor, a pressure regulator, and the commercial process.

2. The method of claim 1, wherein the working fluid comprises a mixture of at least two different working fluids, wherein each component of the mixture has at least two different saturation temperatures within the at least one manifold.

3. The method of claim 1, wherein the working fluid has a saturation temperature in the manifold-cooling system of 50° C. to 80° C., inclusive.

4. The method of claim 1, wherein the cooling system further comprises at least two manifolds that are in thermal communication with the computer system.

5. The method of claim 1, wherein the information comprises a Bitcoin hash.

6. The method of claim 1, wherein the information comprises an artificial intelligence (AI) computation.

7. The method of claim 1, further comprising monitoring and controlling at least three of the computer system, the at least one manifold, the compressor, the pressure regulator, and the commercial process.

8. The method of claim 1, further comprising using feedback to control a rate of electrical energy usage by the computer system as a function of electrical energy cost and/or computational incentives.

9. A system that uses thermal energy resulting from an information processing system to drive a district heating system, comprising:
    a computer system configured to generate information;
    an at least one manifold in thermal communication with the computer system;
    an elevated-low-pressure liquid-phase of the working fluid;
    an elevated-low-pressure vapor-phase of the working fluid;
    a compressor configured to extract the elevated-low-pressure vapor-phase of the working fluid from the at least one manifold to the compressor;
    wherein the compressor is further configured to compress the elevated-low-pressure vapor-phase of the working fluid to produce an elevated-high-pressure vapor-phase of the working fluid, thereby increasing the temperature of the working fluid;
    a heat exchanger configured to transfer thermal energy from the elevated-high-pressure vapor-phase of the working fluid to drive a commercial process, during which the elevated-high-pressure vapor-phase of the working fluid is condensed to an elevated-high-pressure liquid-phase of the working fluid;
    a pressure regulator configured to reduce the pressure of the elevated-high-pressure liquid-phase of the working fluid to the elevated-low-pressure liquid-phase of working fluid, which is returned to the at least one manifold; and
    a controller configured to monitor and control among at least one of the computer system, the at least one manifold, the compressor, the pressure regulator, and the commercial process.

10. The system of claim 9, wherein the computer system comprises a processor configured to mine Bitcoins.

11. The system of claim 9, wherein the system is sized and dimensioned to contain at least 6 Bitcoin miners.

12. The system of claim 9, wherein the system is configured for substantially isobaric phase change of the working fluid from the elevated-low-pressure liquid-phase of the working fluid to the elevated-low-pressure vapor-phase of the working fluid.

13. The system of claim 9, wherein the compressor is configured for substantially isentropic compression of the working fluid, from the elevated-low-pressure vapor-phase of the working fluid to the elevated-high-pressure vapor-phase of the working fluid.

14. The system of claim 9, wherein the heat exchanger is configured for substantially isobaric condensation of the working fluid, wherein thermal energy is transferred from the working fluid to the commercial process, resulting in at least a partial phase change of the working fluid from elevated-high-pressure vapor-phase of the working fluid to elevated-high-pressure liquid-phase of the working fluid.

15. The system of claim 9, wherein the pressure regulator is configured for substantially isenthalpic pressure reduction of the working fluid from the elevated-high-pressure liquid-phase of the working fluid to the elevated-low-pressure liquid-phase of the working fluid.

16. The system of claim 9, further comprising a controller configured to control at least two of the computer system, the compressor, the pressure regulator, and the commercial process.

17. The system of claim 9, further comprising a controller configured to feedback to control a rate of electrical energy usage by the computer system as a function of electrical energy cost and/or computational incentives.

18. The system of claim 9, wherein the pressure inside the at least one manifold is at least 1.1 atm.

19. The system of claim 9, wherein the pressure inside the at least one manifold is between 2 and 10 atm.

20. The system of claim 9, wherein the pressure inside the at least one manifold is at least 5 atm.

\* \* \* \* \*